(12) United States Patent
Kim et al.

(10) Patent No.: US 10,879,163 B2
(45) Date of Patent: Dec. 29, 2020

(54) FAN-OUT SEMICONDUCTOR PACKAGE HAVING REDISTRIBUTION LINE STRUCTURE

(71) Applicant: Samsung Electronics Co., Ltd., Suwon-si (KR)

(72) Inventors: Jong-Youn Kim, Seoul (KR); Seok-Hyun Lee, Hwaseong-si (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 0 days.

(21) Appl. No.: 16/299,307

(22) Filed: Mar. 12, 2019

(65) Prior Publication Data

US 2020/0043840 A1    Feb. 6, 2020

(30) Foreign Application Priority Data

Jul. 31, 2018 (KR) .................. 10-2018-0089507

(51) Int. Cl.
*H01L 23/498* (2006.01)
*H01L 23/31* (2006.01)
(Continued)

(52) U.S. Cl.
CPC .... *H01L 23/49838* (2013.01); *H01L 21/4857* (2013.01); *H01L 21/561* (2013.01);
(Continued)

(58) Field of Classification Search
CPC . H01L 2924/15174; H01L 2924/15311; H01L 2224/131; H01L 2224/92125; H01L 2224/0401; H01L 2224/32225; H01L 2224/16227; H01L 2224/83005; H01L 24/20; H01L 21/6835; H01L 2924/181;
(Continued)

(56) References Cited

U.S. PATENT DOCUMENTS 6,707,153 B2   3/2004   Kuwabara et al.
7,157,796 B2   1/2007   Yamagata
(Continued)

FOREIGN PATENT DOCUMENTS

JP   4401527 B2   1/2010
JP   4654598 B2   3/2011
(Continued)

*Primary Examiner* — Cuong B Nguyen
(74) *Attorney, Agent, or Firm* — Harness, Dickey & Pierce, P.L.C.

(57) ABSTRACT

A fan-out semiconductor package including a redistribution line structure is provided. The fan-out semiconductor package includes a plurality of redistribution line insulating layers and a plurality of redistribution line patterns arranged on at least one of an upper surface and a lower surface of each of the plurality of redistribution line insulating layers; at least one semiconductor chip arranged on the redistribution line structure and occupying a footprint having a horizontal width that is less than a horizontal width of the redistribution line structure; and a molding member surrounding the at least one semiconductor chip on the redistribution line structure and having a horizontal width that is greater than the horizontal width of the redistribution line structure, wherein the plurality of redistribution line insulating layers have a cascade structure.

20 Claims, 17 Drawing Sheets

(51) Int. Cl.
　　　*H01L 23/538*　　　(2006.01)
　　　*H01L 21/56*　　　(2006.01)
　　　*H01L 25/065*　　　(2006.01)
　　　*H01L 21/48*　　　(2006.01)

(52) U.S. Cl.
　　　CPC .... *H01L 23/3128* (2013.01); *H01L 23/49822* (2013.01); *H01L 23/5386* (2013.01); *H01L 25/0655* (2013.01)

(58) Field of Classification Search
　　　CPC ........... H01L 2221/68345; H01L 24/32; H01L 2224/04105; H01L 2924/18161; H01L 2224/97; H01L 2224/73204
　　　See application file for complete search history.

(56) References Cited

U.S. PATENT DOCUMENTS

| | | | |
|---|---|---|---|
| 7,618,886 B2 | 11/2009 | Jobetto et al. | |
| 7,898,813 B2 * | 3/2011 | Nishiyama | H01L 24/49 361/737 |
| 9,640,580 B2 | 5/2017 | Lee et al. | |
| 2015/0255359 A1 * | 9/2015 | Furutani | H01L 23/293 361/761 |
| 2017/0098589 A1 | 4/2017 | Liu et al. | |
| 2019/0333847 A1 * | 10/2019 | Watanabe | H01L 21/6835 |

FOREIGN PATENT DOCUMENTS

| | | |
|---|---|---|
| KR | 101127516 B1 | 3/2012 |
| KR | 101824727 B1 | 3/2018 |

\* cited by examiner

FAN-OUT SEMICONDUCTOR PACKAGE HAVING REDISTRIBUTION LINE STRUCTURE

CROSS-REFERENCE TO RELATED APPLICATION

This application claims the benefit of Korean Patent Application No. 10-2018-0089507, filed on Jul. 31, 2018, in the Korean Intellectual Property Office, the disclosure of which is incorporated herein in its entirety by reference.

BACKGROUND

The inventive concepts relate to a semiconductor package, and more particularly, to a fan-out semiconductor package having a redistribution line structure.

With the development in electronic industries and demand from users, electronic devices have become smaller and/or multi-functional and have higher capacity. This leads to the requirement for a highly integrated semiconductor chip.

Specifically, in a highly integrated semiconductor chip having an increased number of input and output (I/O) terminals, distances between the I/O terminals may be reduced, and thus, interference between the I/O terminals may occur. A fan-out semiconductor package has been used to increase the distances between the I/O terminals.

SUMMARY

The inventive concepts provide a fan-out semiconductor package having a redistribution line structure having improved reliability.

According to an aspect of the inventive concepts, there is provided a fan-out semiconductor package including a redistribution line structure including a plurality of redistribution line insulating layers and a plurality of redistribution line patterns on at least one of an upper surface and a lower surface of each of the plurality of redistribution line insulating layers at least one semiconductor chip on the redistribution line structure and occupying a footprint having a horizontal width that is less than a horizontal width of the redistribution line structure, and a molding member surrounding the at least one semiconductor chip on the redistribution line structure and having a horizontal width that is greater than the horizontal width of the redistribution line structure, wherein the plurality of redistribution line insulating layers have a cascade structure.

According to another aspect of the inventive concepts, there is provided a fan-out semiconductor package including a redistribution line structure including a plurality of redistribution line insulating layers having a cascade structure, and a plurality of redistribution line patterns on at least one of an upper surface and a lower surface of each of the plurality of redistribution line insulating layers, at least one semiconductor chip on the redistribution line structure and electrically connected to the plurality of redistribution line patterns, and a molding member surrounding the at least one semiconductor chip on the redistribution line structure, wherein a horizontal width of the redistribution line insulating layer from among the plurality of redistribution line insulating layers, farther from the at least one semiconductor chip, is greater than a horizontal width of the redistribution line insulating layer from among the plurality of redistribution line insulating layers, closer to the at least one semiconductor chip.

According to another aspect of the inventive concepts, there is provided a fan-out semiconductor package including a redistribution line structure including a plurality of redistribution line insulating layers having a cascade structure, a plurality of redistribution line patterns on an upper surface of at least one of the plurality of redistribution line insulating layers, and a plurality of redistribution line via patterns connected to the plurality of redistribution line patterns and penetrating at least one of the plurality of redistribution line insulating layers, at least one semiconductor chip on the redistribution line structure and electrically connected to the plurality of redistribution line patterns and the plurality of redistribution line via patterns, and a molding member surrounding the at least one semiconductor chip on the redistribution line structure, and protruding farther outside the redistribution line structure in a horizontal direction, wherein side surfaces of each of the plurality of redistribution line insulating layers are inclined surfaces each having an acute angle from a normal line with respect to a lower surface of each of the plurality of redistribution line insulating layers, and an acute angle of a side surface of one of the plurality of redistribution line insulating layers is less than acute angles of side surfaces of the other of the plurality of redistribution line insulating layers.

BRIEF DESCRIPTION OF THE DRAWINGS

Embodiments of the inventive concepts will be more clearly understood from the following detailed description taken in conjunction with the accompanying drawings in which:

FIGS. 1A and 1B are cross-sectional views of a fan-out semiconductor package according to at least one embodiment, wherein FIG. 1B is an enlarged cross-sectional view of a region 1b of FIG. 1A;

FIGS. 5A and 5B are cross-sectional views of a fan-out semiconductor package according to at least one embodiment, wherein FIG. 5B is an enlarged cross-sectional view of a region Vb of FIG. 5A;

DETAILED DESCRIPTION OF EMBODIMENTS

Figure 1A:
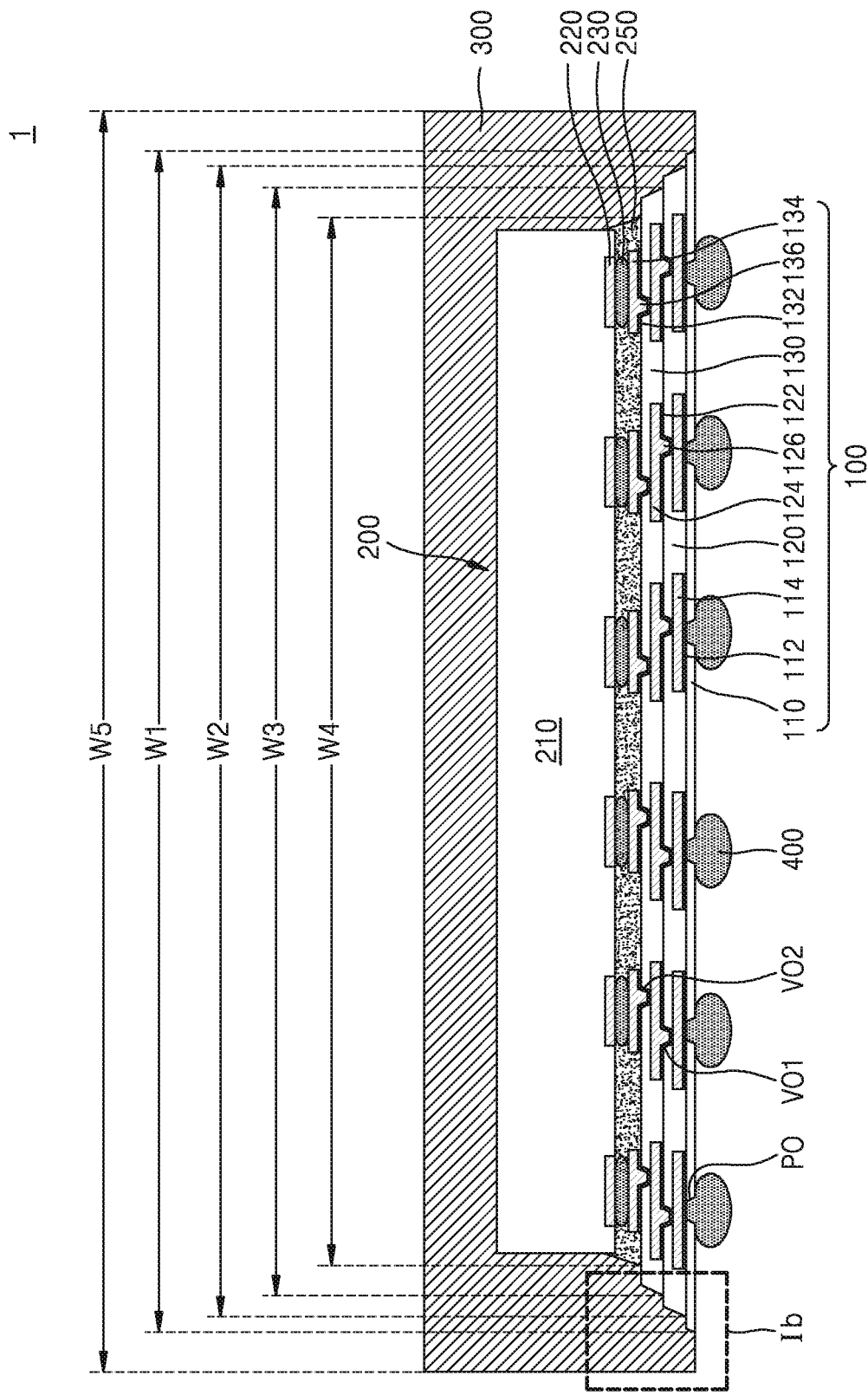
Figure 1B:
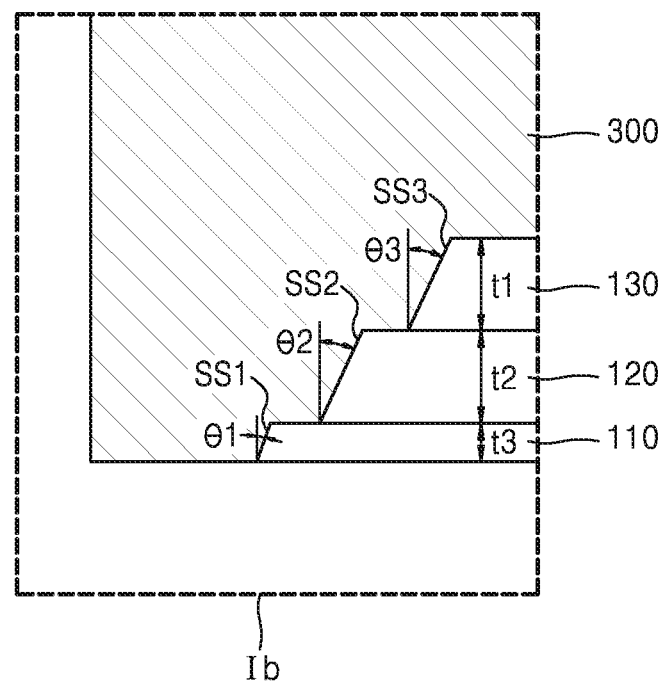

FIGS. 1A and 1B are cross-sectional views of a fan-out semiconductor package 1, according to at least one embodiment. In detail, FIG. 1B is an enlarged cross-sectional view of a region 1b of FIG. 1A.

Referring to FIGS. 1A and 1B, the fan-out semiconductor package 1 may include a redistribution line structure 100 and a semiconductor chip 200 on the redistribution line structure 100.

The redistribution line structure 100 may include a plurality of redistribution line insulating layers 110, 120, and 130, a plurality of redistribution line patterns 114, 124, and 134 arranged on at least one of an upper surface and a lower surface of each of the plurality of redistribution line insulating layers 110, 120, and 130, and/or a plurality of redistribution line via patterns 126 and 136 each penetrating at least one of the plurality of redistribution line insulating layers 110, 120, and 130 and connected to at least one of the plurality of redistribution line patterns 114, 124, and 134 by contacting the at least one of the plurality of redistribution line patterns 114, 124, and 134.

Each of the plurality of redistribution line insulating layers 110, 120, and 130 may include, for example, a material layer including an organic compound. In some embodiments, each of the plurality of redistribution line insulating layers 110, 120, and 130 may include a material layer including an organic polymer material. In some embodiments, each of the plurality of redistribution line insulating layers 110, 120, and 130 may include photosensitive polyimide (PSPI).

A plurality of seed layers 112, 122, and 132 may be between each of the plurality of redistribution line patterns 114, 124, and 134 and the plurality of redistribution line via patterns 126 and 136, and any one of the plurality of redistribution line insulating layers 110, 120, and 130. In some embodiments, the plurality of seed layers 112, 122, and 132 may be formed by using physical vapor deposition, and the plurality of redistribution line patterns 114, 124, and 134 and the plurality of redistribution line via patterns 126 and 136 may be formed by using electroless plating.

The plurality of seed layers 112, 122, and 132 may include, for example, a material selected from the group consisting of Cu, Ti, TiW, TiN, Ta, TaN, Cr, and Al. However, materials of the plurality of seed layers 112, 122, and 132 are not limited thereto. In some embodiments, the plurality of seed layers 112, 122, and 132 may include Cu/Ti, that is, Cu stacked on Ti, or Cu/TiW, that is, Cu stacked on TiW.

The plurality of redistribution line patterns 114, 124, and 134 and the plurality of redistribution line via patterns 126 and 136 may include, but are not limited to, a metal, such as Cu, Al, W, Ti, Ta, In, Mo, Mn, Co, Sn, Ni, Mg, Re, Be, Ga, Ru, etc., or an alloy thereof. In some embodiments, when Cu is included in the plurality of redistribution line patterns 114, 124, and 134 and the plurality of redistribution line via patterns 126 and 136, at least one of the plurality of seed layers 112, 122, and 132 may operate as a diffusion barrier layer.

One or more of the plurality of redistribution line patterns 114, 124, and 134 may be integrally formed with one or more of the plurality of redistribution line via patterns 126 and 136. For example, one or more of the plurality of redistribution line patterns 114, 124, and 134 may be integrally formed with one or more of the plurality of redistribution line via patterns 126 and 136, the one or more of the plurality of redistribution line via patterns 126 and 136 contacting upper portions of the one or more of the plurality of redistribution line patterns 114, 124, and 134, or may be integrally formed with one or more of the plurality of redistribution line via patterns 126 and 136, the one or more of the plurality of redistribution line via patterns 126 and 136 contacting lower portions of the one or more of the plurality of redistribution line patterns 114, 124, and 134.

The plurality of redistribution line insulating layers 110, 120, and 130 may include a first redistribution line insulating layer 110, a second redistribution line insulating layer 120, and a third redistribution line insulating layer 130 that are sequentially stacked. The plurality of seed layers 112, 122, and 132 may include a first seed layer 112, a second seed layer 122, and a third seed layer 132 contacting the first through third redistribution line insulating layers 110 through 130, respectively. The plurality of redistribution line patterns 114, 124, and 134 may include a first redistribution line pattern 114 at an upper surface of the first redistribution line insulating layer 110, a second redistribution line pattern 124 at an upper surface of the second redistribution line insulating layer 120, and a third redistribution line pattern 134 at an upper surface of the third redistribution line insulating layer 130. The plurality of redistribution line via patterns 126 and 136 may include a first redistribution line via pattern 126 on the first redistribution line pattern 114 and a second redistribution line via pattern 136 on the second redistribution line pattern 124.

A detailed structure of the redistribution line structure 100 will be described below.

The first seed layer 112 is arranged on a portion of the upper surface of the first redistribution line insulating layer 110 and the first redistribution line pattern 114 is arranged on the first seed layer 112. The first seed layer 112 is between the upper surface of the first redistribution line insulating layer 110 and a lower surface of the first redistribution line pattern 114.

The second redistribution line insulating layer 120 is stacked on the first redistribution line insulating layer 110, wherein the second redistribution line insulating layer 120 covers a portion of the first redistribution line pattern 114 and has a first via opening VO1 exposing the remaining portions of the first redistribution line pattern 114. A horizontal width W2 of the second redistribution line insulating layer 120 may be less than a horizontal width W1 of the first redistribution line insulating layer 110.

The second seed layer 122 is arranged at a portion of the upper surface of the second redistribution line insulating layer 120, an inner side surface of the first via opening VO1, and a portion of the upper surface of the first redistribution line pattern 114, the portion of the upper surface of the first redistribution line pattern 114 being exposed via the first via opening VO1. The first redistribution line via pattern 126 and the second redistribution line pattern 124 are arranged on the second seed layer 122. The first redistribution line via pattern 126 may cover a portion of the second seed layer 122, the portion of the second seed layer 122 being in the first via opening VO1 and filling the first via opening VO1. The second redistribution line pattern 124 may be arranged at a portion of the second seed layer 122 on the upper surface of the second redistribution line insulating layer 120, and on the first redistribution line via pattern 126.

The second seed layer 122 may be between the second redistribution line pattern 124 and the first redistribution via pattern 126, and the second redistribution line insulating layer 120, and between the first redistribution line via pattern 126 and the first redistribution line pattern 114. The first redistribution line via pattern 126 and the second redistribution line pattern 124 may be integrally formed.

The third redistribution line insulating layer 130 is stacked on the second redistribution line insulating layer 120, wherein the third redistribution line insulating layer 130 covers a portion of the second redistribution line pattern 124 and has a second via opening VO2 exposing the remaining portions of the second redistribution line pattern 124. A horizontal width W3 of the third redistribution line insulating layer 130 may be less than the horizontal width W2 of the second redistribution line insulating layer 120.

The third seed layer 132 is arranged at a portion of the upper surface of the third redistribution line insulating layer 130, an inner side surface of the second via opening VO2, and a portion of the upper surface of the second redistribution line pattern 124, the portion of the upper surface of the second redistribution line pattern 124 being exposed via the second via opening VO2. The second redistribution line via pattern 136 and the third redistribution line pattern 134 are arranged on the third seed layer 132. The second redistribution line via pattern 136 may cover a portion of the third seed layer 132, the portion being in the second via opening VO2 and may fill the second via opening VO2. The third redistribution line pattern 134 may be arranged at a portion of the third seed layer 132 on the upper surface of the third redistribution line insulating layer 130, and on the second redistribution line via pattern 136.

The third seed layer 132 may be between the third redistribution line pattern 134 and the second redistribution via pattern 136, and the third redistribution line insulating layer 130, and between the second redistribution line via pattern 136 and the second redistribution line pattern 124. The second redistribution line via pattern 136 and the third redistribution line pattern 134 may be integrally formed.

FIG. 1A illustrates that the redistribution line structure 100 includes the three redistribution line insulating layers 110, 120, and 130, the three redistribution line patterns 114, 124, and 134, and the two redistribution line via patterns 126 and 136. However, the redistribution line structure 100 is not limited thereto, and may be variously modified according to a design of circuit wires in the redistribution line structure 100.

For example, the redistribution line structure 100 may include more than two, three, or four redistribution line insulating layers. For example, the redistribution line structure 100 may have the redistribution line patterns, the number of which is less than the number of redistribution line insulating layers by one, the redistribution line patterns, the number of which is the same as the number of redistribution line insulating layers, or the redistribution line patterns, the number of which is greater than the number of redistribution line insulating layers by one. For example, the redistribution line structure 100 may have the redistribution line via patterns, the number of which is less than the number of redistribution line insulating layers by two, the redistribution line via patterns, the number of which is less than the number of redistribution line insulating layers by one, or the redistribution line via patterns, the number of which is the same as the number of redistribution line insulating layers.

In some embodiments, a portion of an uppermost redistribution line pattern from among the redistribution line patterns 114, 124, and 134, for example, a portion of the third redistribution line pattern 134 may perform a function of a chip connection pad to which the semiconductor chip 200 is coupled. In some embodiments, a portion of a lowermost redistribution line pattern from among the redistribution line patterns 114, 124, and 134, for example, a portion of the first redistribution line pattern 114 may perform a function of a terminal connection pad to which an external connection terminal 400 is coupled.

The semiconductor chip 200 may be coupled on the redistribution line structure 100. A horizontal width W4 of the semiconductor chip 200 may be less than the horizontal width W3 of the third redistribution line insulating layer 130.

The redistribution line structure 100 may protrude farther outside than the semiconductor chip 200 in a horizontal direction. For example, each of the first through third redistribution line insulating layers 110 through 130 included in the redistribution line structure 100 may extend to protrude farther outside than the semiconductor chip 200 in the horizontal direction.

The plurality of redistribution line insulating layers 110, 120, and 130 included in the redistribution line structure 100 may have a cascade structure, in which widths of the plurality of redistribution line insulating layers 110, 120, and 130 increase away from the semiconductor chip 200.

In some embodiments, at least one of the plurality of redistribution line patterns 114, 124, and 134 included in the redistribution line structure 100 may protrude farther outside than the semiconductor chip 200 in a horizontal direction. FIG. 1A illustrates that a portion of the first redistribution line pattern 114 and a portion of the second redistribution line pattern 124 from among the plurality of redistribution line patterns 114, 124, and 134 protrude farther outside than the semiconductor chip 200 in the horizontal direction. However, the inventive concepts are not limited thereto. For example, a portion of the first redistribution line pattern 114 from among the plurality of redistribution line patterns 114, 124, and 134 may protrude farther outside than the semiconductor chip 200 in the horizontal direction, or a portion of each of the first through third redistribution line patterns 114, 124, and 134 may protrude farther outside than the semiconductor chip 200 in the horizontal direction.

The semiconductor chip 200 may include, for example, a central processing unit (CPU) chip, a graphics processing unit (GPU) chip, or an application processor (AP) chip. The semiconductor chip 200 may be, for example, a dynamic random access memory (DRAM) chip, a static random access memory (SRAM) chip, a flash memory chip, an electrically erasable and programmable read-only memory (EEPROM) chip, a phase-change RAM (PRAM) chip, a magnetic RAM (MRAM) chip, or a resistive RAM (RRAM) chip.

The semiconductor chip 200 may include a semiconductor substrate 210 and a chip pad 220 arranged on a surface of the semiconductor substrate 210.

The chip pad 220 of the semiconductor chip 200 may be connected to the third redistribution line pattern 134 of the redistribution line structure 100 via a chip connection member 230. The chip connection member 230 may include, for example, a bump, a solder ball, or a conductive pillar.

The semiconductor substrate 210 may include, for example, silicon (Si). Alternatively, the semiconductor substrate 210 may include a semiconductor element, such as germanium (Ge), or a compound semiconductor, such as silicon carbide (SiC), gallium arsenide (GaAs), indium arsenide (InAs), and indium phosphide (InP). The semiconductor substrate 210 may have an active surface and a non-active surface opposite to the active surface. In some embodiments, the active surface of the semiconductor substrate 210 may be toward the redistribution line structure 100.

A semiconductor device including a plurality of various types of individual devices may be formed at the active surface of the semiconductor substrate 210, in the semiconductor chip 200.

An underfill material layer 250 surrounding the chip connection member 230 may be filled between the semiconductor chip 200 and the redistribution line structure 100. The underfill material layer 250 may include, for example, epoxy resins formed by using a capillary underfill method. In some embodiments, the underfill material layer 250 may be a non-conductive film (NCF).

The fan-out semiconductor package 1 may include a molding member 300 surrounding the semiconductor chip 200 on the redistribution line structure 100. The molding member 300 may include, for example, an epoxy molding compound (EMC). The molding member 300 may surround an upper surface of the redistribution line structure 100 and side surfaces and an upper surface of the semiconductor chip 200. The molding member 300 may cover a portion of an upper surface and side surfaces of each of the plurality of redistribution line insulating layers 110, 120, and 130 included in the redistribution line structure 100.

The molding member 300 may protrude farther outside than the redistribution line structure 100 in a horizontal direction. A horizontal width W5 of the molding member 300 may be greater than the horizontal width W1 of the first redistribution line insulating layer 110. That is, the horizontal width W5 of the molding member 300 may be greater than a total width of the redistribution line structure 100.

A lower surface of the molding member 300 and a lower surface of the redistribution line structure 100, for example, a lower surface of the first redistribution line insulating layer 110, may be at a same level. Also, the lower surface of the molding member 300 and the lower surface of the redistribution line structure 100, for example, the lower surface of the first redistribution insulating layer 110, may be coplanar.

Side surfaces of each of the plurality of redistribution line insulating layers 110 through 130 may be inclined surfaces each having an acute angle (between 0° and 90°) from a normal line with respect to a lower surface of each of the plurality of redistribution line insulating layers 110 through 130. In some embodiments, each of the plurality of redistribution line insulating layers 110 through 130 may increase in width away from the semiconductor chip 200. The first through third redistribution line insulating layers 110 through 130 may have a first side surface SS1, a second side surface SS2, and a third side surface SS3, respectively.

The first side surface SS1 of the first redistribution line insulating layer 110 may be an inclined surface having a first angle θ1 from the normal line with respect to the lower surface of the first redistribution line insulating layer 110. The second side surface SS2 of the second redistribution line insulating layer 120 may be an inclined surface having a second angle θ2 from the normal line with respect to the lower surface of the second redistribution line insulating layer 120. The third side surface SS3 of the third redistribution line insulating layer 130 may be an inclined surface having a third angle θ3 from the normal line with respect to the lower surface of the third redistribution line insulating layer 130.

Any one of the first through third angles θ1 through θ3 may have a different value from the others. That is, any one of the first through third side surfaces SS1 through SS3 may be an inclined surface having a different inclination from the others. For example, the first angle θ1 may be less than each of the second and third angles θ2 and θ3. That is, the first side surface SS1 may be a more steeply inclined surface than the second and third side surfaces SS2 and SS3. In some embodiments, the second and third angles θ2 and θ3 may be the same or substantially the same, but are not limited thereto. That is, the second and third side surfaces SS2 and SS3 may be the inclined surfaces having the same or substantially the same inclination, but are not limited thereto.

A thickness of any one of the plurality of redistribution line insulating layers 110 through 130 may be different from thicknesses of the others. The first redistribution line insulating layer 110 may have a first thickness t3, the second redistribution line insulating layer 120 may have a second thickness t2, and the third redistribution line insulating layer 130 may have a third thickness t1. For example, the first thickness t3 may be less than each of the second and third thicknesses t2 and t1. That is, the first redistribution line insulating layer 110 may be thinner than each of the second and third redistribution line insulating layers 120 and 130. In some embodiments, the second thickness t2 and the third thickness t1 may be the same or substantially the same as each other, but are not limited thereto. That is, the second redistribution line insulating layer 120 and the third redistribution line insulating layer 130 may have the same or substantially the same thickness as each other, but are not limited thereto.

According to the fan-out semiconductor package 1 according to the inventive concepts, the side surfaces of the redistribution line structure 100, that is, the first through third side surfaces SS1 through SS3 of the first through third redistribution line insulating layers 110 through 130, respectively, may be covered by the molding member 300. Thus, interfaces between the plurality of redistribution line insulating layers 110 through 130, for example, the interface between the first and second redistribution line insulating layers 110 and 120 and the interface between the second and third redistribution line insulating layers 120 and 130, may not be exposed to the outside.

In particular, when a plurality of fan-out semiconductor packages are formed altogether and the plurality of fan-out semiconductor packages are separated into separate fan-out semiconductor packages by performing a sawing process, a cutting process is performed on the molding member 300, rather than the redistribution line structure 100, and thus, damage to the plurality of redistribution line insulating layers 110 through 130 may be reduced or prevented. Accordingly, the plurality of redistribution line insulating layers 110 through 130 may not be detached, or cracks in the plurality of redistribution line insulating layers 110 through 130 may be reduced or prevented. Thus, the fan-out semiconductor package 1 having reliability may be provided.

FIGS. 2A through 2L are cross-sectional views for sequentially describing a method of manufacturing a fan-out semiconductor package, according to at least one embodiment. In detail, FIGS. 2A through 2L are the cross-sectional views for sequentially describing the method of manufacturing the fan-out semiconductor package 1 illustrated in FIGS. 1A and 1B, by showing a process of manufacturing two fan-out semiconductor packages together, wherein only a portion of each of the two fan-out semiconductor packages, the portion being adjacent to each other, is illustrated.

Figure 2A:
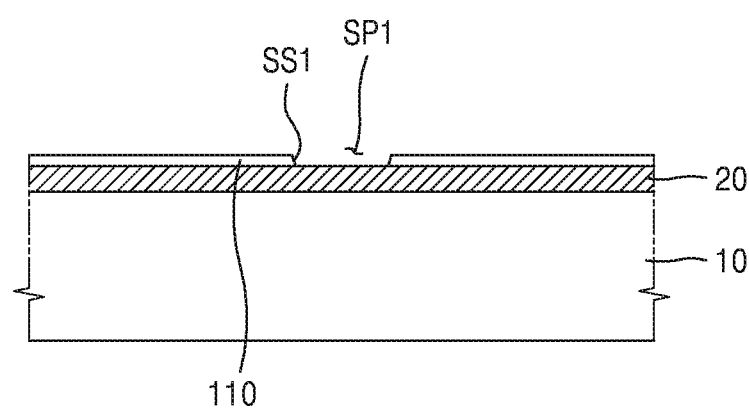
FIGS. 2A through 2L are cross-sectional views showing a sequence of a method of manufacturing a fan-out semiconductor package, according to at least one embodiment.

Referring to FIG. 2A, the first redistribution insulating layer 110 having a first separate space SP1 may be formed on a carrier substrate 10 to which a release film 20 is coupled. Although described below, the first separate space SP1 is an area at which a package sawing process is performed to separate two fan-out semiconductor packages formed together into separate fan-out semiconductor packages.

The carrier substrate 10 may support an organic insulating layer and may include a material having the stability for a baking process and an etching process. When the carrier substrate 10 is to be later separated and removed by using laser ablation, the carrier substrate 10 may be a transparent substrate. Selectively, when the carrier substrate 10 is to be later separated and removed by heating, the carrier substrate 10 may include a heat-resistant substrate. In some embodiments, the carrier substrate 10 may include a glass substrate. In other embodiments, the carrier substrate 10 may include, but is not limited to, a heat-resistance organic polymer material, such as polyimide (PI), polyether etherketone (PEEK), polyether sulfone (PES), polyphenylene sulfide (PPS), etc.

The release film 20 may include, for example, a laser-reactive layer which may be later vaporized by reacting with the radiation of a laser beam, so as to separate the carrier substrate 10. The release film 20 may include a carbon-based material layer. For example, the release film 20 may include an amorphous carbon layer (ACL), or a spin-on hard (SOH) mask including a hydrocarbon compound having a relatively high carbon content of about 85 weight % through about 99 weight % or derivatives thereof.

The first redistribution line insulating layer 110 may have the first side surface SS1 at a side of the first separate space SP1. The first side surface SS1 may be an inclined surface having an acute angle from a normal line with respect to a circumferential surface of the carrier substrate 10 or a normal line with respect to a lower surface of the first redistribution line insulating layer 110.

Figure 2B:
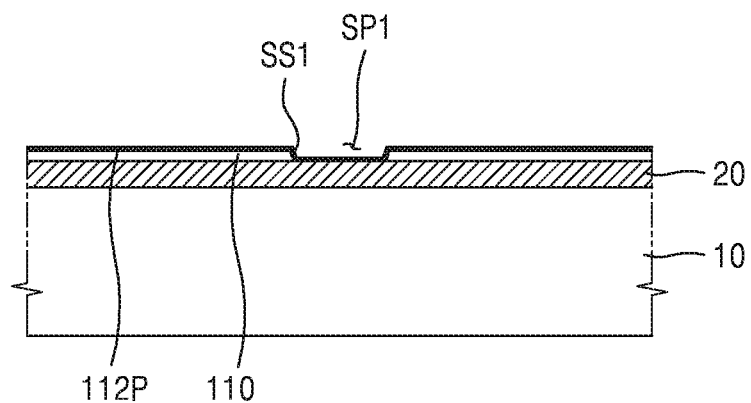

Referring to FIG. 2B, a first preliminary seed layer 112P may be formed. The first preliminary seed layer 112P may be conformally formed to cover an upper surface of the first redistribution line insulating layer 110, the first side surface SS1, which is an inner side surface of the first separate space SP1, and a lower surface of the first separate space SP1.

Figure 2C:
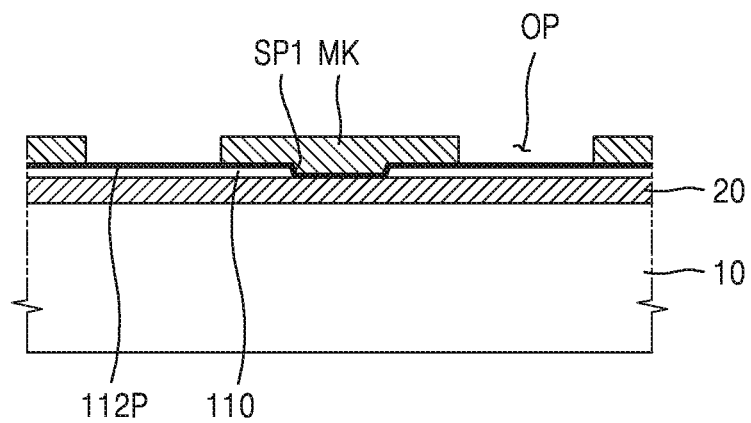

Referring to FIG. 2C, a mask pattern MK having an opening OP may be formed on the first preliminary seed layer 112P. The mask pattern MK may completely cover the first separate space SP1 and the opening OP may overlap a portion of the first redistribution line insulating layer 110.

Figure 2D:
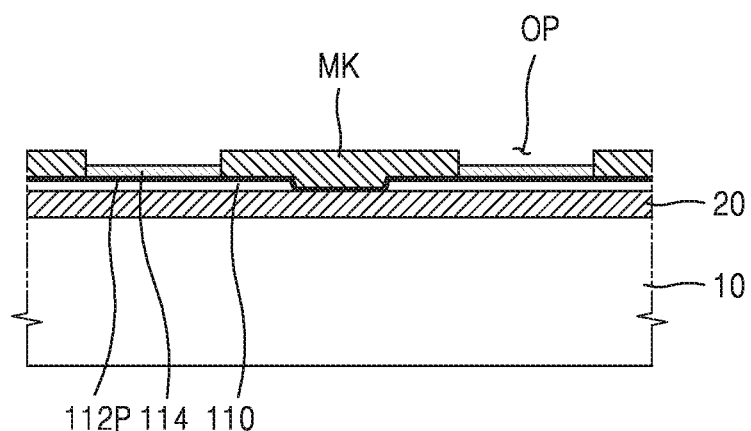

Referring to FIG. 2D, the first redistribution line pattern 114 may be formed on a portion of the first preliminary seed layer 112P, the portion being exposed in the opening OP, by performing electroless plating.

Figure 2E:
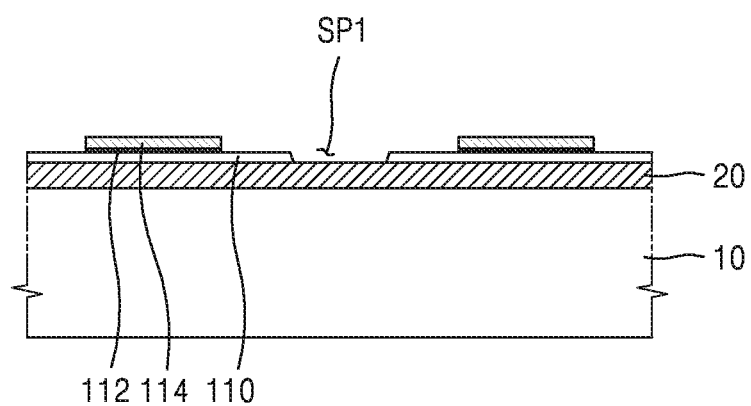

Referring to FIGS. 2D and 2E together, the mask pattern MK may be removed and a portion of the first preliminary seed layer 112P, the portion being exposed by removing the mask pattern MK, may be removed to form the first seed layer 112. The first seed layer 112 may be between the first redistribution line pattern 114 and the first redistribution line insulating layer 110.

Figure 2F:
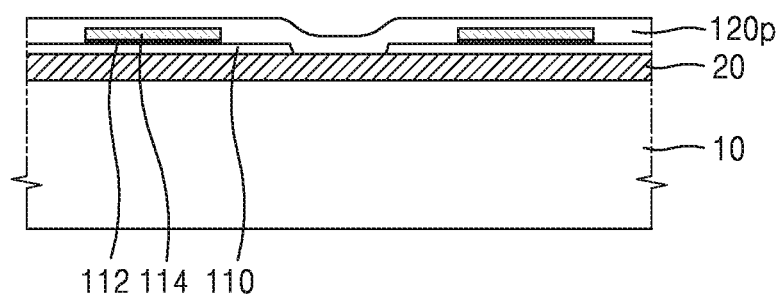

Referring to FIG. 2F, a redistribution line insulating material layer 120p may be formed on a resultant structure of FIG. 2E. The redistribution line insulating material layer 120p may completely cover the first redistribution line pattern 114. The redistribution line insulating material layer 120p may include a material layer including an organic compound. In some embodiments, the redistribution line insulating material layer 120p may include a material layer including an organic polymer material. In some embodiments, the redistribution line insulating material layer 120p may include a polymer material having negative photosensitivity. In some embodiments, the redistribution line insulating material layer 120p may include a photosensitive PI resin having negative photosensitivity.

In some embodiments, the redistribution line insulating material layer 120p may be formed by spin coating and soft baking. The soft baking may be performed, for example, by performing a heating process at a temperature of about 150° C. to about 350° C. for about 10 seconds to about 5 minutes, but is not limited thereto.

In some embodiments, the redistribution line insulating material layer 120p may have a generally flat upper surface at a portion thereof, the portion overlapping the first redistribution line insulating layer 110, and a concave supper surface at a portion thereof, the portion overlapping the first separate space SPl (refer to FIG. 2E).

Figure 2G:
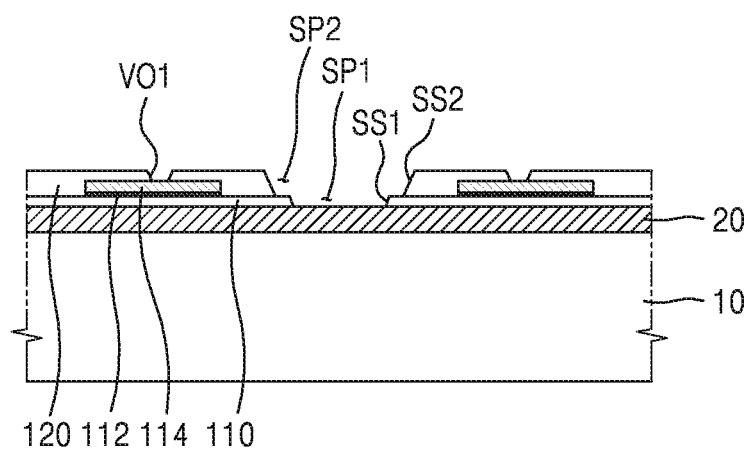

Referring to FIG. 2G, the second redistribution line insulating layer 120 having the first via opening VO1 and a second separate space SP2 may be formed by exposing and developing the redistribution line insulating material layer 120p (refer to FIG. 2F). The second separate space SP2 may be connected to the first separate space SP1. A portion of the first redistribution line pattern 114 may be exposed at a lower surface of the first via opening VO1.

The second redistribution line insulating layer 120 may have the second side surface SS2 at a side of the second separate space SP2. The second side surface SS2 may be an inclined surface having an acute angle from the normal line with respect to the circumferential surface of the carrier substrate 10 or a normal line with respect to a lower surface of the second redistribution line insulating layer 120.

The second redistribution line insulating layer 120 may be formed by using substantially the same method as the first redistribution line insulating layer 110 illustrated in FIG. 2A.

Figure 2H:
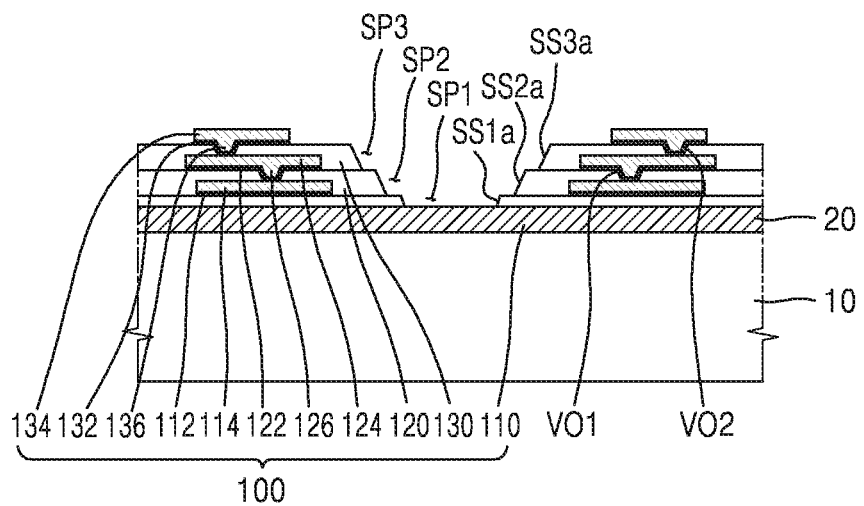

Referring to FIG. 2H, the processes described with reference to FIGS. 2B through 2G may be repeatedly performed to form the second seed layer 122, the second redistribution line pattern 124, the first redistribution line via pattern 126, the third redistribution line insulating layer 130 having the second via opening VO2 and a third separate space SP3, the third seed layer 132, the third redistribution line pattern 134, and the first redistribution line via pattern 136.

The second redistribution line pattern 124 and the first redistribution line via pattern 126 may be integrally formed with each other, and the first redistribution line via pattern 126 may fill the first via opening VO1. The third redistribution line pattern 134 and the second redistribution line via pattern 136 may be integrally formed, and the second redistribution line via pattern 136 may fill the second via opening VO2.

The third separate space SP3 may be connected to the second separate space SP2 and the first separate space SP1. The third redistribution line insulating layer 130 may have the third side surface SS3 at a side of the third separate space SP3. The third side surface SS3 may be an inclined surface having an acute angle from the normal line with respect to the circumferential surface of the carrier substrate 10 or a normal line with respect to a lower surface of the third redistribution line insulating layer 130.

The plurality of redistribution line insulating layers 110, 120, and 130 included in the redistribution line structure 100 may be formed to have a cascade structure, in which the plurality of redistribution line insulating layers 110, 120, and 130 increase in width away from the carrier substrate 10. Each of the plurality of redistribution line insulating layers 110, 120, and 130 may increase in width away from the carrier substrate 10.

Figure 2I:
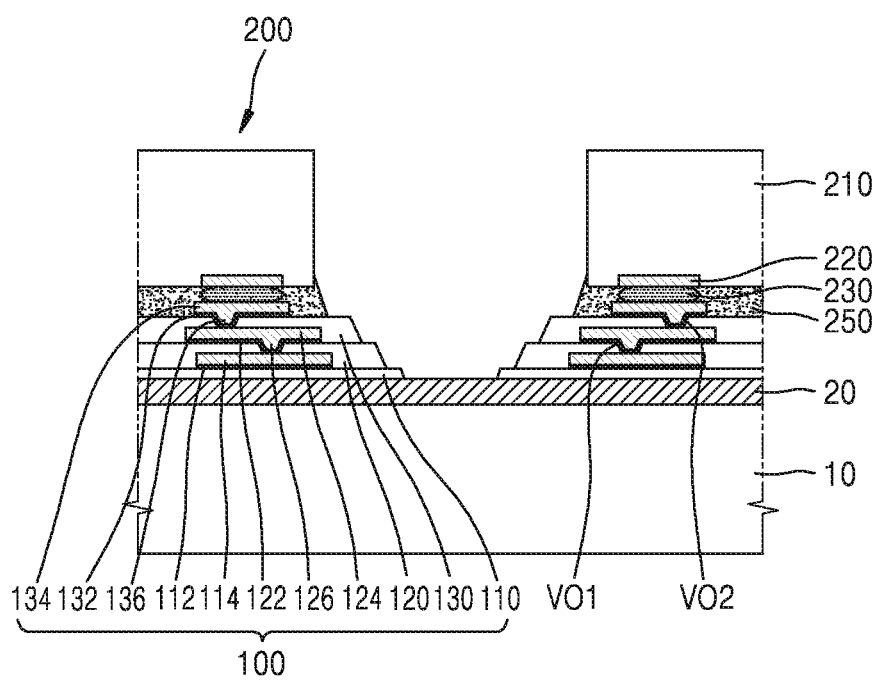

Referring to FIG. 2I, the semiconductor chip 200 may be coupled on the redistribution line structure 100. The semiconductor chip 200 may be coupled to the redistribution line structure 100 such that the chip pad 220 arranged on an active surface of the semiconductor substrate 210 is toward the redistribution line structure 100. The chip pad 220 of the semiconductor chip 200 may be connected to the third redistribution line pattern 134 of the redistribution line structure 100 via the chip connection member 230.

The underfill material layer 250 surrounding the chip connection member 230 may be filled between the semiconductor chip 200 and the redistribution line structure 100. The underfill material layer 250 may be formed by using a capillary tube underfill method, after the semiconductor chip 200 is coupled to the redistribution line structure 100. In some embodiments, the underfill material layer 250 may be formed by coupling the semiconductor chip 200 on the redistribution line structure 100, after coupling an NCF on the chip pad 220 of the semiconductor chip 200.

Figure 2J:
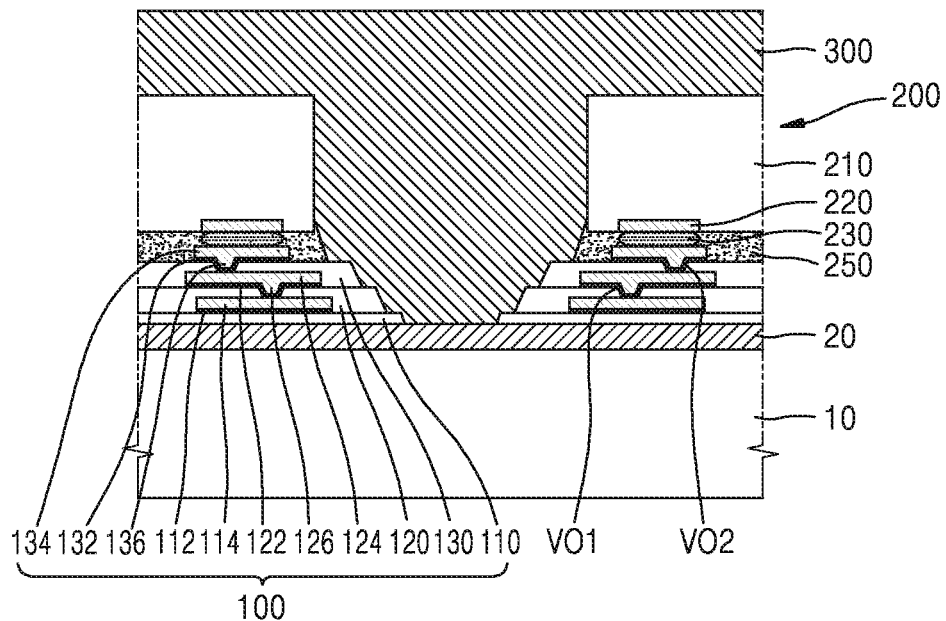

Referring to FIG. 2J, the molding member 300 surrounding side surfaces and an upper surface of the semiconductor chip 200 may be formed on the redistribution line structure 100 to which the semiconductor chip 200 is coupled. The molding member 300 may include, for example, an EMC. The molding member 300 may fill the first through third separate spaces SP1, SP2, and SP3 (refer to FIG. 2H), and may contact a portion of the release film 20, the portion being below the first through third separate spaces SP1 through SP3, the first through third side surfaces SS1, SS2, and SS3 (refer to FIG. 2H) of the first through third redistribution line insulating layers 110 through 130, respectively, an upper surface of the third redistribution line insulating layer 130, and the side surfaces and the upper surface of the semiconductor chip 200.

Figure 2K:
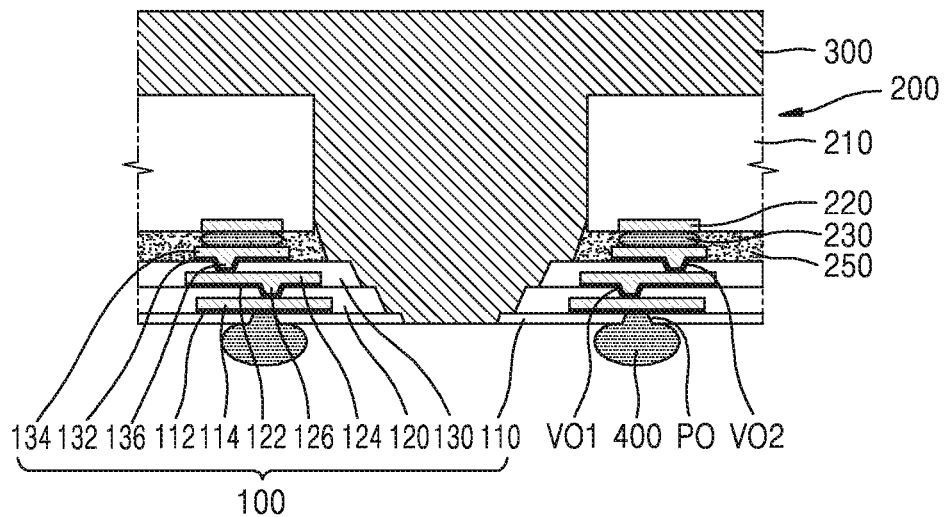

Referring to FIGS. 2J and 2K together, based on a resultant structure of FIG. 2J, the carrier substrate 10 to which the release film 20 is coupled may be separated from the redistribution line structure 100. Thereafter, a portion of the first redistribution line insulating layer 110 may be removed to form a pad opening PO, through which the first seed layer 112 and the first redistribution line pattern 114 are partially exposed, and the external connection terminal 400 may be coupled to the first seed layer 112 and the first redistribution line pattern 114 via the pad opening PO.

Figure 2L:
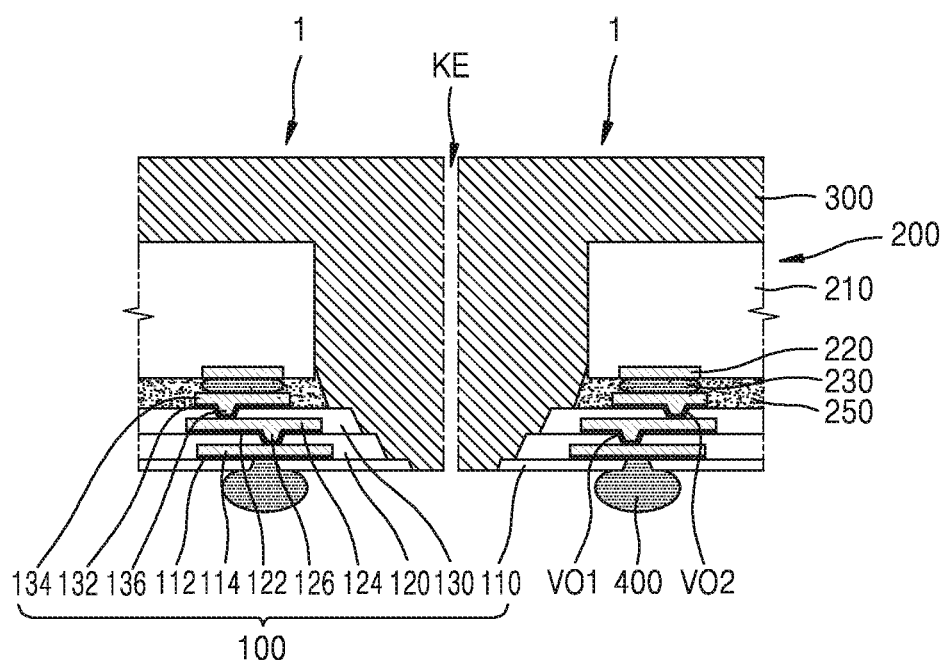

Referring to FIG. 2L, a package sawing process may be performed on a resultant structure of FIG. 2K, to form the fan-out semiconductor packages 1 separated with a kerf space KE therebetween.

The package sawing process may be performed by cutting the molding member 300 and forming the kerf space KE in the molding member 300. Thus, the kerf space KE may be spaced apart from the side surfaces of the redistribution line structure 100, that is, the first through third side surfaces SS1 through SS3 (refer to FIG. 1B) of the first through third redistribution insulating layers 110 through 130, respectively. Thus, the first through third side surfaces SS1 through SS3 of the first through third redistribution line insulating layers 110 through 130, respectively, may be covered by the molding member 300. Thus, interfaces between the plurality of redistribution line insulating layers 110 through 130, for example, the interface between the first and second redistribution line insulating layers 110 and 120 and the interface between the second and third redistribution line insulating layers 120 and 130 may not be exposed to the outside.

Thus, in the process of manufacturing the fan-out semiconductor package 1, damage to the plurality of redistribution line insulating layers 110 through 130 may be reduced or prevented, and thus, the plurality of redistribution line insulating layers 110 through 130 may be reduced or prevented from being detached or cracks may be reduced or prevented from occurring in the plurality of redistribution line patterns 114, 124, and 134.

Figure 3:
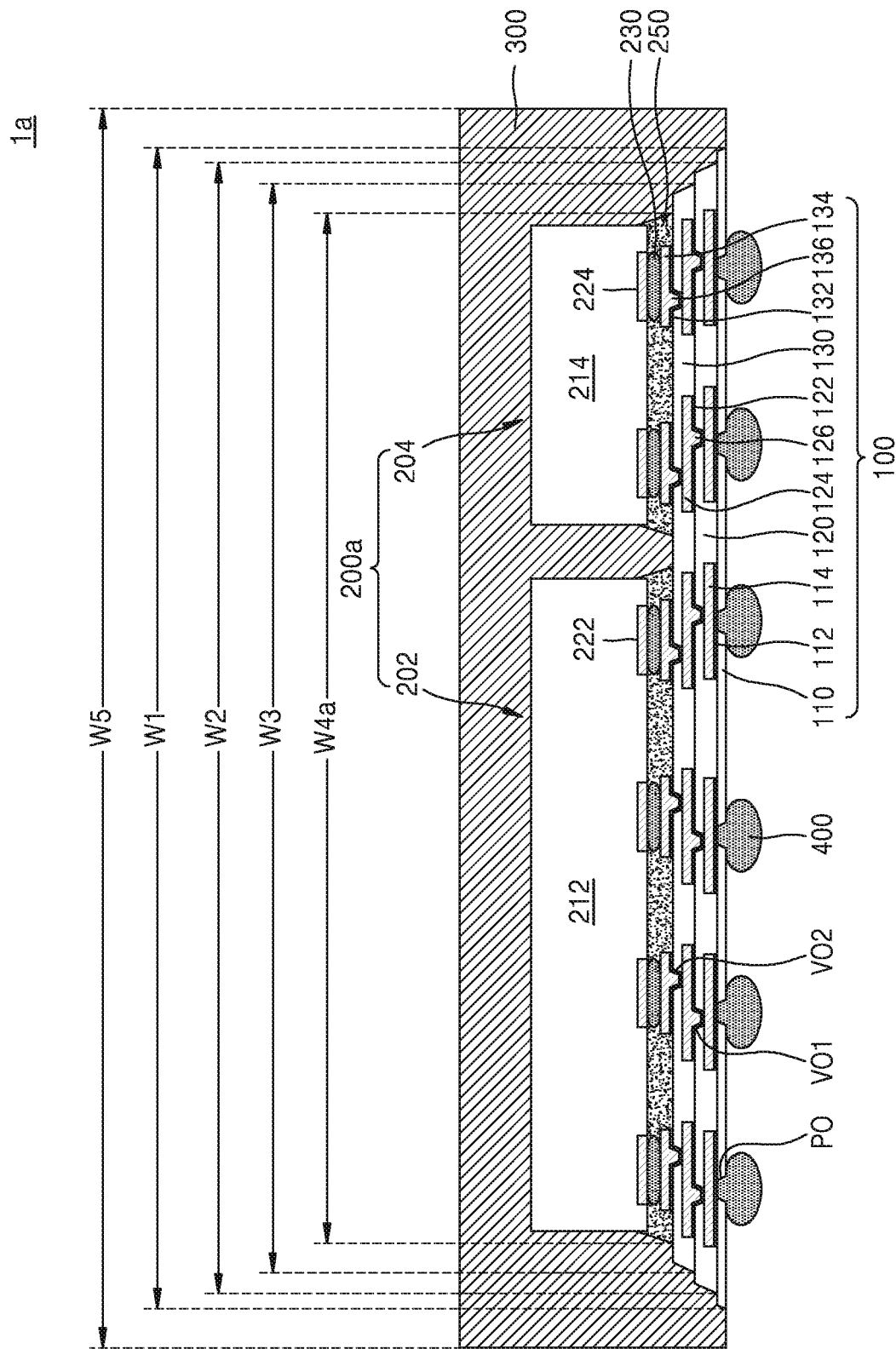
FIG. 3 is a cross-sectional view of a fan-out semiconductor package according to at least one embodiment.

FIG. 3 is a cross-sectional view of a fan-out semiconductor package 1a according to at least one embodiment. Descriptions of aspects with respect to FIG. 3, the aspects being the same as those with respect to FIGS. 1A and 1B, will be omitted, and aspects with respect to FIG. 3, the aspects being different from those with respect to FIGS. 1A and 1B, will be mainly described.

Referring to FIG. 3, the fan-out semiconductor package 1a may include the redistribution line structure 100 and a plurality of semiconductor chips 200a that are spaced apart from each other on the redistribution line structure 100.

The plurality of semiconductor chips 200a may include a first semiconductor chip 202 and a second semiconductor chip 204. The first semiconductor chip 202 may include, for example, a CPU chip, a GPU chip, or an AP chip. The second semiconductor chip 204 may include, for example, a DRAM chip, an SRAM chip, a flash memory chip, an EEPROM chip, a PRAM chip, an MRAM chip, or an RRAM chip. In some embodiments, the second semiconductor chip 204 may be a high bandwidth memory (HBM) DRAM semiconductor chip.

A footprint occupied by the plurality of semiconductor chips 200a may be less than a horizontal area of the redistribution line structure 100. The total footprint occupied by the plurality of semiconductor chips 200a may overlap the redistribution line structure 100 in a vertical direction.

A horizontal width W4a of the footprint occupied by the plurality of semiconductor chips 200a may be less than each of the horizontal width W1 of the first redistribution line insulating layer 110, the horizontal width W2 of the second redistribution line insulating layer 120, the horizontal width W3 of the third redistribution line insulating layer 130, and the horizontal width W5 of the molding member 300.

Figure 4:
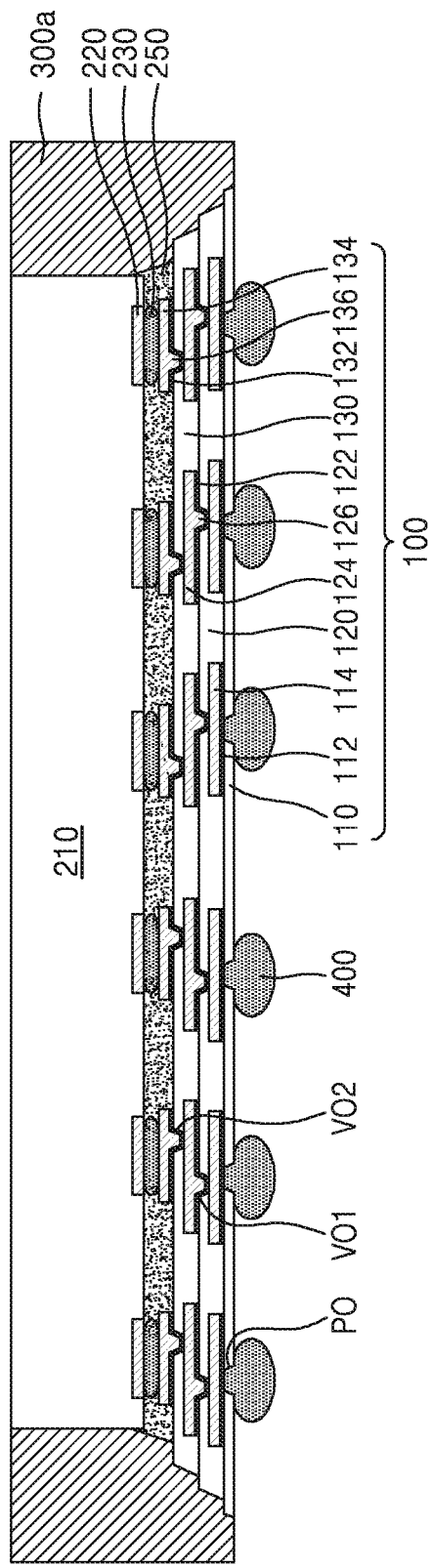
FIG. 4 is a cross-sectional view of a fan-out semiconductor package according to at least one embodiment.

FIG. 4 is a cross-sectional view of a fan-out semiconductor package 1b according to at least one embodiment. Descriptions of aspects with respect to FIG. 4, the aspects being the same as those with respect to FIGS. 1A and 1B, will be omitted, and aspects with respect to FIG. 4, the aspects being different from those with respect to FIGS. 1A and 1B, will be mainly described.

Referring to FIG. 4, the fan-out semiconductor package 1b may include the redistribution line structure 100 and the semiconductor chip 200 on the redistribution line structure 100.

The fan-out semiconductor package 1b may farther include a molding member 300a surrounding the semiconductor chip 200 on the redistribution line structure 100. The molding member 300a may surround an upper surface of the redistribution line structure 100 and side surfaces of the semiconductor chip 200 but may not cover and may expose an upper surface of the semiconductor chip 200, the upper surface being a non-active surface. The molding member 300a may cover a portion of an upper surface and a side surface of each of the plurality of redistribution line insulating layers 110, 120, and 130 included in the redistribution line structure 100.

In some embodiments, a heat discharging member may be coupled on the upper surface of the semiconductor chip 200. The heat discharging member may be, for example, a heat slug or a heat sink. In some embodiments, a thermal interface material (TIM) may be arranged between the heat discharging member and the upper surface of the semiconductor chip 200. The TIM may include, for example, mineral oil, grease, gap filler putty, phase change gel, phase change material pads, or particle filled epoxy.

Figure 5A:
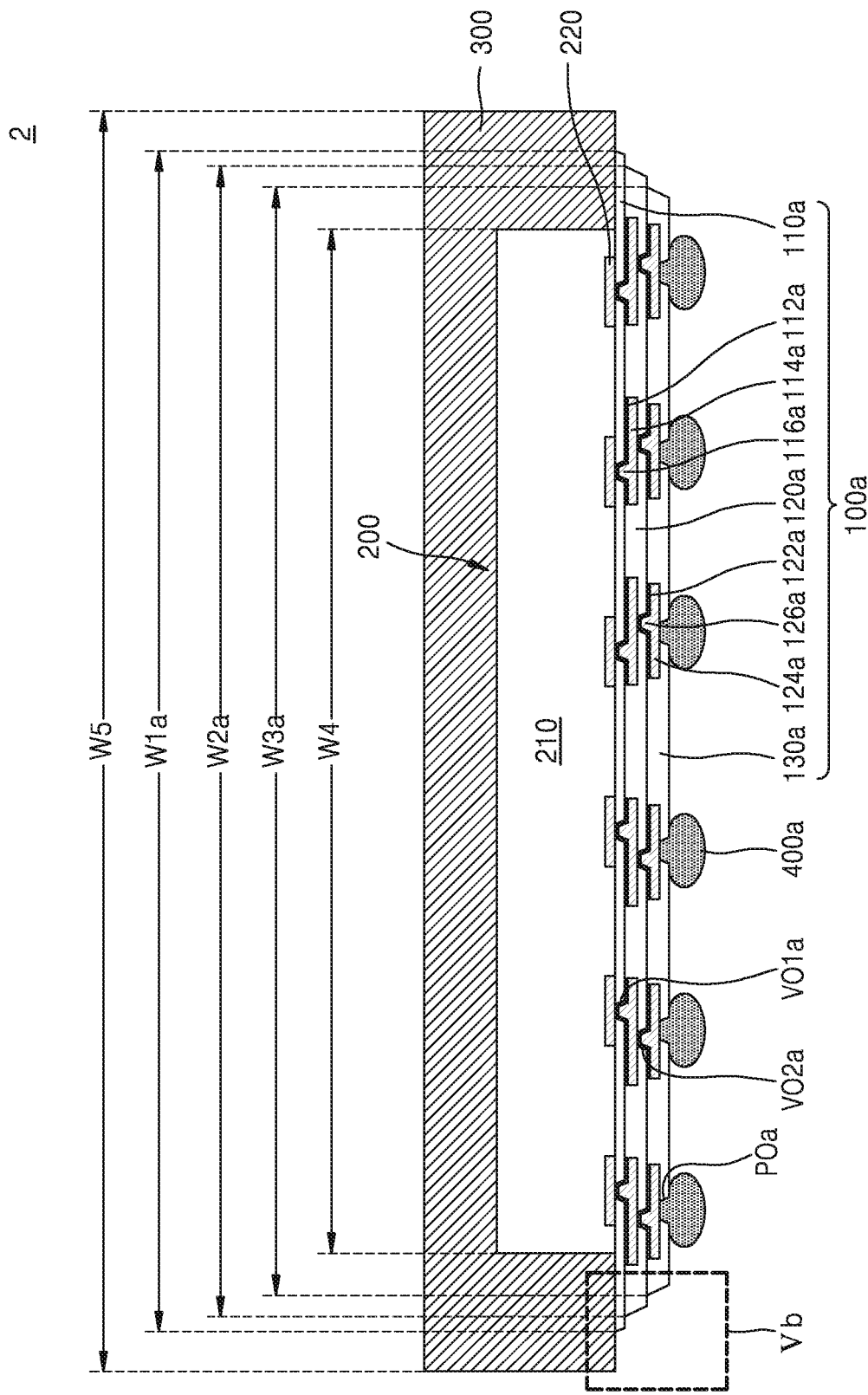
Figure 5B:
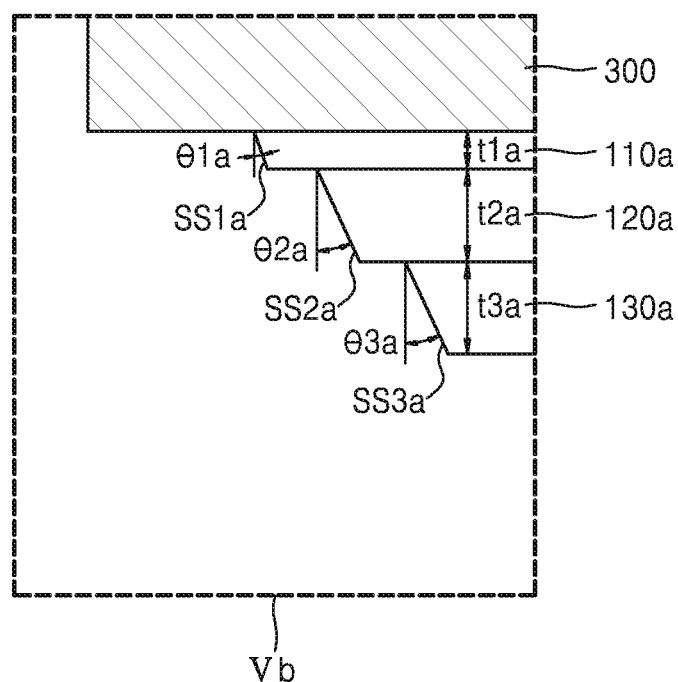

FIGS. 5A and 5B are cross-sectional views of a fan-out semiconductor package 2 according to at least one embodiment. In detail, FIG. 5B is an enlarged cross-sectional view of a region Vb of FIG. 5A.

Referring to FIGS. 5A and 5B together, the fan-out semiconductor package 2 may include a redistribution line structure 100a and the semiconductor chip 200 on the redistribution line structure 100a.

The redistribution line structure 100a may include a plurality of redistribution line insulating layers 110a, 120a, and 130a, a plurality of redistribution line patterns 114a and 124a arranged at least one of an upper surface and a lower surface of each of the plurality of redistribution line insulating layers 110a, 120a, and 130a, and a plurality of redistribution line via patterns 116a and 126a penetrating at least one of the plurality of redistribution line insulating layers 110a, 120a, and 130a and connected to at least one of the plurality of redistribution line patterns 114a and 124a by contacting the at least one of the plurality of redistribution line patterns 114a and 124a.

A plurality of seed layers 112a and 122a may be between each of the plurality of redistribution line patterns 114a and 124a and the plurality of redistribution line via patterns 116a and 126a, and any one of the plurality of redistribution line insulating layers 110a, 120a, and 130a.

The plurality of redistribution line insulating layers 110a, 120a, and 130a, the plurality of seed layers 112a and 122a, the plurality of redistribution line patterns 114a and 124a, and the plurality of redistribution line via patterns 116a and 126a may be generally the same as the plurality of redistribution line insulating layers 110, 120, and 130, the plurality of seed layers 112, 122, and 123, the plurality of redistribution line patterns 114, 124, and 134, and the plurality of redistribution line via patterns 126 and 136, described with reference to FIGS. 1A and 1B, and thus, detailed descriptions will not be given, and different aspects will be mainly described.

At least one of the plurality of redistribution line patterns 114a and 124a may be integrally formed with at least one of the plurality of redistribution line via patterns 116a and 126a. For example, at least one of the plurality of redistribution line patterns 114a and 124a may be integrally formed with at least one of the plurality of redistribution line via patterns 116a and 126a, the at least one of the plurality of redistribution line via patterns 116a and 126a contacting an upper portion of the at least one of the plurality of redistribution line patterns 114a and 124a, or may be integrally formed with at least one of the plurality of redistribution line via patterns 116a and 126a, the at least one of the plurality of redistribution line via patterns 116a and 126a contacting a lower portion of the at least one of the plurality of redistribution line patterns 114a and 124a.

The plurality of redistribution line insulating layers 110a, 120a, and 130a may include a first redistribution line insulating layer 110a, a second redistribution line insulating layer 120a, and a third redistribution line insulating layer 130a, which are sequentially stacked. The plurality of seed layers 112a and 122a may include a first seed layer 112a and a second seed layer 122a contacting the first and second redistribution line insulating layers 110a and 120a, respectively. The plurality of redistribution line patterns 114a and 124a may include a first redistribution line pattern 114a below the first redistribution line insulating layer 110a, and a second redistribution line pattern 124a above the second redistribution line insulating layer 120a. The plurality of redistribution line via patterns 116a and 126a may include a first redistribution line via pattern 116a on the first redistribution line pattern 114a and a second redistribution line via pattern 126a on the second redistribution line pattern 124a.

A structure of the redistribution line structure 100a will be described in detail. The first seed layer 112a may be arranged on a portion of a lower surface of the first redistribution line insulating layer 110a having a first via opening VO1a, through which a portion of a lower surface of the chip pad 220 of the semiconductor chip 200 is exposed, an inner side surface of the first via opening VO1a, and the portion of the lower surface of the chip pad 220, the portion being exposed through the first via opening VO1a. The first redistribution line via pattern 116a and the first redistribution line pattern 114a may be arranged on the first seed layer 112a. The first redistribution line via pattern 116a may cover a portion of the first seed layer 112a, the portion being in the first via opening VO1a, and may fill the first via opening VO1a. The first redistribution line pattern 114a may be arranged on a portion of the first seed layer 112a, the portion being on the lower surface of the first redistribution line insulating layer 110a, and may be arranged on the first redistribution line via pattern 116a.

The first seed layer 112a may be between the first redistribution line pattern 114a and the first redistribution line via pattern 116a, and the first redistribution line insulating layer 110a, and between the first redistribution line via pattern 116a and the chip pad 220. The first redistribution line via pattern 116a and the first redistribution line pattern 114 may be integrally formed.

The second redistribution line insulating layer 120a including a second via opening VO2a may be stacked on the lower surface of the first redistribution line insulating layer 110a, wherein the second via opening VO2a covers a portion of the first redistribution line pattern 114a and exposes the remaining portions of the first redistribution line pattern 114a. A horizontal width W2a of the second redistribution line insulating layer 120a may be less than a horizontal width W1a of the first redistribution line insulating layer 110a.

The second seed layer 122a may be arranged on a portion of a lower surface of the second redistribution line insulating layer 120a having the second via opening VO2a, through which a portion of a lower surface of the first redistribution line pattern 114a is exposed, an inner side surface of the second via opening VO2a, and the portion of the lower surface of the first redistribution line pattern 114a, the portion being exposed through the second via opening VO2a. The second redistribution line via pattern 126a and the second redistribution line pattern 124a may be arranged on the second seed layer 122a. The second redistribution line via pattern 126a may cover a portion of the second seed layer 122a, the portion being in the second via opening VO2a, and may fill the second via opening VO2a. The second redistribution line pattern 124a may be arranged on a portion of the second seed layer 122a, the portion being on the lower surface of the second redistribution line insulating layer 120a, and may be arranged on the second redistribution line via pattern 126a.

The second seed layer 122a may be between the second redistribution line pattern 124a and the second redistribution line via pattern 126a, and the second redistribution line insulating layer 120a, and between the second redistribution line via pattern 126a and the portion of the lower surface of the first redistribution line pattern 114a, the portion being exposed through the second via opening VO2a. The second redistribution line via pattern 126a and the second redistribution line pattern 124a may be integrally formed.

The third redistribution line insulating layer 130a including a third via opening VO3a may be stacked on a lower surface of the second redistribution line insulating layer 120a, wherein the third via opening VO3a covers a portion of the second redistribution line pattern 124a and exposes the remaining portions of the second redistribution line pattern 124a. A horizontal width W3a of the third redistribution line insulating layer 130a may be less than the horizontal width W2a of the second redistribution line insulating layer 120a.

FIG. 5A illustrates that the redistribution line structure 100a includes the three redistribution line insulating layers 110a, 120a, and 130a, the two redistribution line patterns 114a and 124a, and the two redistribution line via patterns 116a and 126a. However, the redistribution line structure 100a is not limited thereto, and may be variously modified according to a design of circuit wires in the redistribution structure 100a.

For example, the redistribution line structure 100a may include more than two, three, or four redistribution line insulating layers. For example, the redistribution line structure 100a may have the redistribution line patterns, the number of which is less than the number of the redistribution line insulating layers by one, the number of which is the same as the number of the redistribution line insulating layers, or the number of which is greater than the number of the redistribution line insulating layers by one. For example, the redistribution line structure 100a may have the redistribution line via patterns, the number of which is less than the number of the redistribution line insulating layers by two, the number of which is less than the number of the redistribution line insulating layers by one, or the number of which is the same as the number of the redistribution line insulating layers.

In some embodiments, a portion of a lowermost redistribution line pattern of the redistribution line patterns 114a and 124a, for example, a portion of the second redistribution line pattern 124a may perform a function of a terminal connection pad to which an external connection terminal 400a is coupled.

The semiconductor chip 200 may be coupled on the redistribution line structure 100a. The horizontal width W4 of the semiconductor chip 200 may be less than the horizontal width W3a of the third redistribution line insulating layer 130.

The redistribution line structure 100a may protrude farther outside than the semiconductor chip 200 in a horizontal direction. For example, each of the first through third redistribution line insulating layers 110a through 130a included in the redistribution line structure 100a may protrude farther outside than the semiconductor chip 200 in the horizontal direction.

In some embodiments, at least one of the plurality of redistribution line patterns 114a and 124a included in the redistribution line structure 100a may protrude farther outside than the semiconductor chip 200 in the horizontal direction. For example, FIG. 1 illustrates that a portion of the first redistribution line pattern 114a and a portion of the second redistribution line pattern 124a protrude farther outside than the semiconductor chip 200 in the horizontal direction. However, the inventive concepts are not limited thereto. For example, a portion of the second redistribution line pattern 124a of the plurality of redistribution line patterns 114a and 124a may protrude farther outside than the semiconductor chip 200 in the horizontal direction.

The semiconductor chip 200 may include a semiconductor substrate 210 and the chip pad 220 arranged on a surface of the semiconductor substrate 210.

The first redistribution line via pattern 116a may be electrically connected to the chip pad 220 of the semiconductor chip 200. The first seed layer 112a may be between the chip pad 220 and the first redistribution line via pattern 116a.

The fan-out semiconductor package 2 may farther include the molding member 300 surrounding the semiconductor chip 200 on the redistribution line structure 100a. The molding member 300 may surround an upper surface of the redistribution line structure 100a and side surfaces and an upper surface of the semiconductor chip 200. The molding member 300 may cover a portion of an upper surface of the first redistribution line insulating layer 110a from among the plurality of redistribution line insulating layers 110a, 120a, and 130a included in the redistribution line structure 100a. The molding member 300 may not cover a side surface of each of the plurality of redistribution line insulating layers 110a, 120a, and 130a.

The molding member 300 may protrude farther outside than the redistribution line structure 100a in the horizontal direction. A horizontal width W5 of the molding member 300 may be greater than the horizontal width W1a of the first redistribution line insulating layer 110a. That is, the horizontal width W5 of the molding member 300 may be greater than a total horizontal width of the redistribution line structure 100a.

A lower surface of the molding member 300, and an upper surface of the redistribution line structure 100a, for example, an upper surface of the first redistribution line insulating layer 110a, may be at a same level. Also, the lower surface of the molding member 300 and the upper surface of the redistribution line structure 100a, for example, the upper surface of the first redistribution line insulating layer 110a, may be coplanar.

A side surface of each of the plurality of redistribution line insulating layers 110a through 130a may be an inclined surface having an acute angle (between 0° and 90°) from a normal line with respect to an upper surface of each of the plurality of redistribution line insulating layers 110a through 130a. The first through third redistribution line insulating layers 110a through 130a may have a first side surface SS1a, a second side surface SS2a, and a third side surface SS3a, respectively.

The first side surface SS1a of the first redistribution line insulating layer 110a may be an inclined surface having a first angle θ1a from the normal line with respect to the upper surface of the first redistribution line insulating layer 110a. The second side surface SS2a of the second redistribution line insulating layer 120a may be an inclined surface having a second angle θ2a from the normal line with respect to the upper surface of the second redistribution line insulating layer 120a. The third side surface SS3a of the third redistribution line insulating layer 130a may be an inclined surface having a third angle θ3a from the normal line with respect to the upper surface of the third redistribution line insulating layer 130a.

Any one of the first through third angles θ1a through θ3a may have a different value from the others. That is, any one of the first through third side surfaces SS1a through SS3a may be an inclined surface having a different inclination from the others. For example, the first angle θ1a may be less than each of the second and third angles θ2a and θ3a. That is, the first side surface SS1a may be a more steeply inclined surface than the second and third side surfaces SS2a and SS3a. In some embodiments, the second and third angles θ2a and θ3a may be the same or substantially the same, but it is not limited thereto. That is, the second and third side surfaces SS2a and SS3a may be the inclined surfaces having the same or substantially the same inclination, but it is not limited thereto.

A thickness of any one of the plurality of redistribution line insulating layers 110a through 130a may be different from thicknesses of the others. The first redistribution line insulating layer 110a may have a first thickness t1a, the second redistribution line insulating layer 120a may have a second thickness t2a, and the third redistribution line insulating layer 130a may have a third thickness t3a. For example, the first thickness t1a may be less than each of the second and third thicknesses t2a and t3a. That is, the first redistribution line insulating layer 110a may be thinner than each of the second and third redistribution line insulating layers 120a and 130a. In some embodiments, the second thickness t2a and the third thickness t3a may be the same or substantially the same as each other, but are not limited thereto. That is, the second redistribution line insulating layer 120a and the third redistribution line insulating layer 130a may have the same or substantially the same thickness as each other, but are not limited thereto.

The fan-out semiconductor package 2 according to the inventive concepts may be formed such that the molding member 300 may not cover the side surface of the redistribution line structure 100a, that is, the first through third side surfaces SS1a through SS3a of the first through third redistribution line insulating layers 110a through 130a, respectively, and the molding member 300 may protrude farther outside than the redistribution line structure 100a in the horizontal direction.

When a plurality of fan-out semiconductor packages are formed altogether and the plurality of fan-out semiconductor packages are separated into separate fan-out semiconductor packages by performing a sawing process, the cutting process is performed on the molding member 300, and the redistribution line structure 100a is apart from a cutting surface of the molding member 300. Thus, damage to the plurality of redistribution line insulating layers 110a through 130a may be reduced or prevented. Accordingly, the plurality of redistribution line insulating layers 110a through 130a may be reduced or prevented from being detached or occurrence of cracks in the plurality of redistribution line patterns 114a and 124a may be reduced or prevented, to provide the fan-out semiconductor package 2 having improved reliability.

FIGS. 6A through 6F are cross-sectional views for sequentially describing a method of manufacturing a fan-out semiconductor package, according to at least one embodiment. In detail, FIGS. 6A through 6F are the cross-sectional views for sequentially describing the method of manufacturing the fan-out semiconductor package 2 illustrated in FIGS. 5A and 5B, by showing a process of manufacturing two fan-out semiconductor packages together, wherein only a portion of each of the two fan-out semiconductor packages, the portion being adjacent to each other, is illustrated, and unlike FIGS. 5A and 5B in which the active surface of the semiconductor substrate 210 is the lower surface, an active surface of the semiconductor substrate 210 is an upper surface.

Figure 6A:
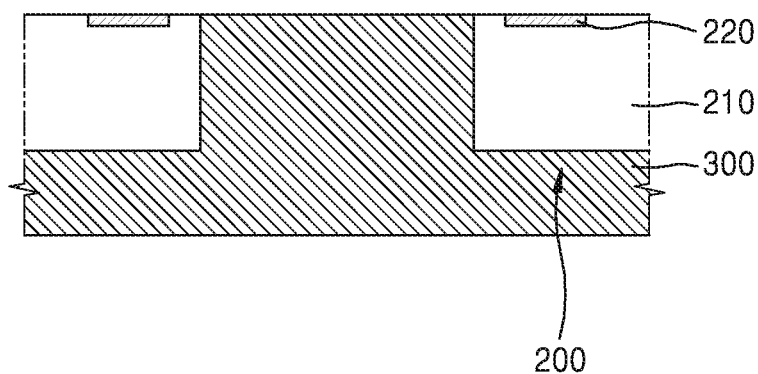
FIGS. 6A through 6F are cross-sectional views showing a sequence of a method of manufacturing a fan-out semiconductor package, according to at least one embodiment.

Referring to FIG. 6A, the molding member 300 surrounding side surfaces and a lower surface of the semiconductor chip 200 having the chip pad 220 arranged on the active surface, which is the upper surface, of the semiconductor substrate 210, may be formed.

Figure 6B:
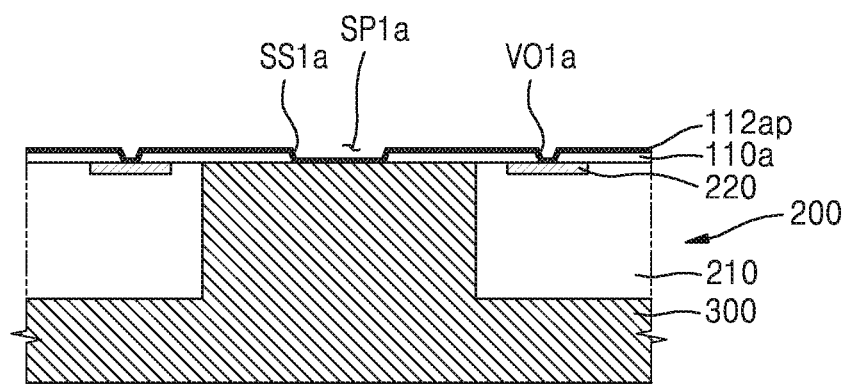

Referring to FIG. 6B, after forming the first redistribution line insulating layer 110a having the first via opening VO1a and the first separate space SP1a on the semiconductor chip 200, the side surfaces and the lower surface of which are covered by the molding member 300, a first preliminary seed layer 112Pa may be formed. The first preliminary seed layer 112Pa may be conformally formed to cover an upper surface of the first redistribution line insulating layer 110a, an inner side surface of the first separate space SP1a, and a lower surface of the first separate space SP1a.

The first redistribution line insulating layer 110a may have the first side surface SS1a at a side of the first separate space SP1a. The first side surface SS1a may be an inclined surface having an acute angle from a normal line with respect to a lower surface of the first redistribution line insulating layer 110a.

Figure 6C:
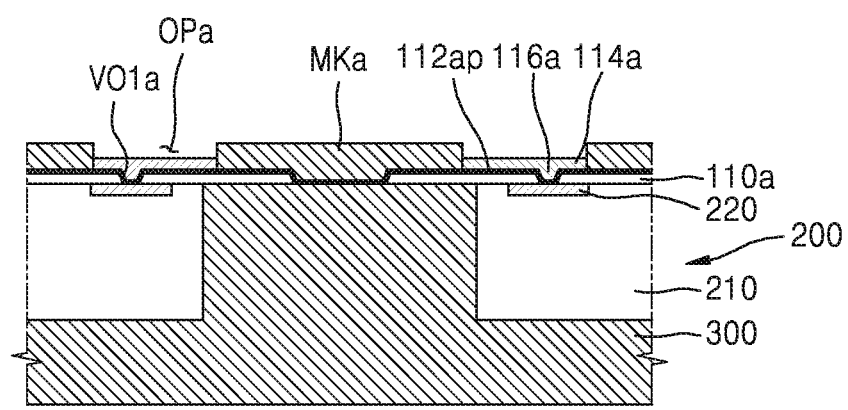

Referring to FIG. 6C, a mask pattern MKa having an opening OPa may be formed on the first preliminary seed layer 112Pa. The mask pattern MKa may completely cover the first separate space SP1a and the opening OPa may be connected to the first via opening VO1a. Thereafter, by performing electroless plating, the first redistribution line pattern 114a and the first redistribution via pattern 116a may be formed on a portion of the first preliminary seed layer 112Pa, the portion being exposed in the opening OPa.

The first redistribution line pattern 114a and the first redistribution line via pattern 116a may be integrally formed with each other, and the first redistribution line via pattern 116a may cover the first via opening VO1a.

Figure 6D:
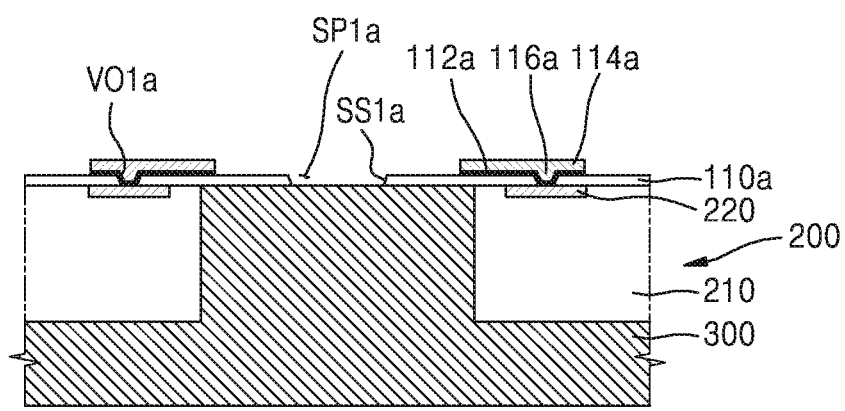

Referring to FIGS. 6C and 6D together, the mask pattern MK may be removed and a portion of the first preliminary seed layer 112Pa, the portion being exposed by removing the mask pattern MKa, may be removed to form the first seed layer 112a.

Figure 6E:
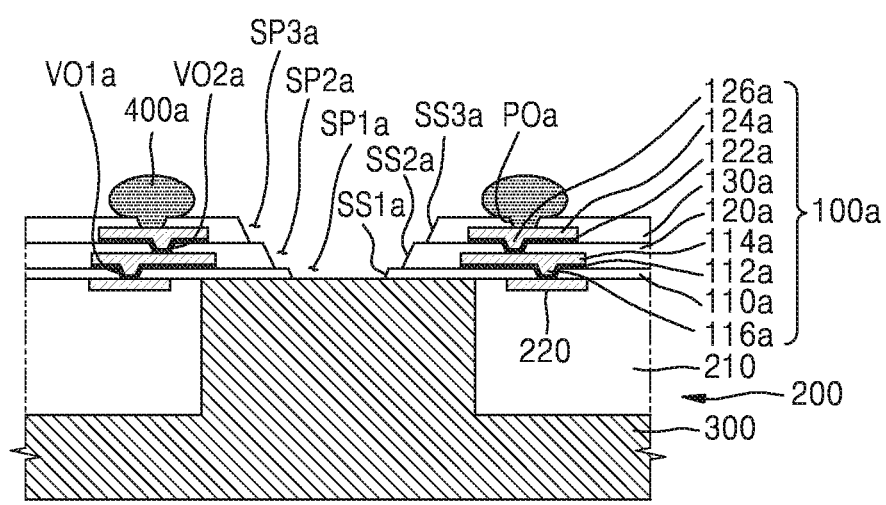

Referring to FIG. 6E, the second redistribution line insulating layer 120a having a second via opening VO2a and a second separate space SP2a, the second seed layer 122a, the second redistribution line pattern 124a, the second redistribution line via pattern 126a, and the third redistribution line insulating layer 130a having a third separate space SP3a and a pad opening POa may be formed on a resultant structure of FIG. 6D. The first separate space SP1a may be connected to the second and third separate spaces SP2a and SP3a.

The second redistribution line pattern 124a and the second redistribution line via pattern 126a may be integrally formed with each other, and the second redistribution line via pattern 126a may fill the second via opening VO2a.

The second redistribution line insulating layer 120a may have the second side surface SS2a at a side of the second separate space SP2a. The second side surface SS2a may be an inclined surface having an acute angle from a normal line with respect to a lower surface of the second redistribution line insulating layer 120a.

The third redistribution line insulating layer 130a may have the third side surface SS3a at a side of the third separate space SP3a. The third side surface SS3a may be an inclined surface having an acute angle from a normal line with respect to a lower surface of the third redistribution line insulating layer 130a.

The plurality of redistribution line insulating layers 110a, 120a, and 130a included in the redistribution line structure 100a may be formed to have a cascade structure in which the plurality of redistribution line insulating layers 110a, 120a, and 130a increase in width away from the semiconductor chip 200 and the molding member 300. Each of the plurality of redistribution line insulating layers 110a, 120a, and 130a may increase in width away from the semiconductor chip 200 and the molding member 300.

Figure 6F:
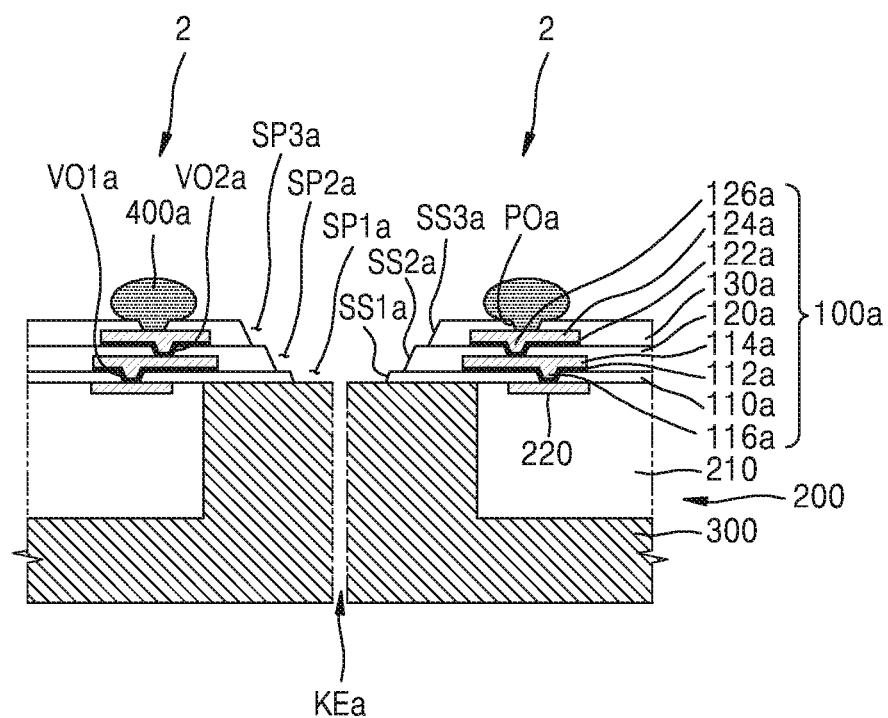

Referring to FIG. 6F, a package sawing process may be performed on a resultant structure of FIG. 6E, to form the fan-out semiconductor packages 2 separated with a kerf space KE therebetween.

The package sawing process may be performed by cutting the molding member 300 and forming the kerf space KE in the molding member 300. Thus, the kerf space KE may be spaced apart from the side surfaces of the redistribution line structure 100a, that is, the first through third side surfaces SS1a through SS3a of the first through third redistribution insulating layers 110a through 130a, respectively.

Thus, damage to the plurality of redistribution line insulating layers 110a through 130a may be reduced or prevented in the package sawing process of the fan-out semiconductor package 2 so that the plurality of redistribution line insulating layers 110a through 130a may not be detached or cracks may not occur in the plurality of redistribution line patterns 114a, 124a, and 134a.

Figure 7:
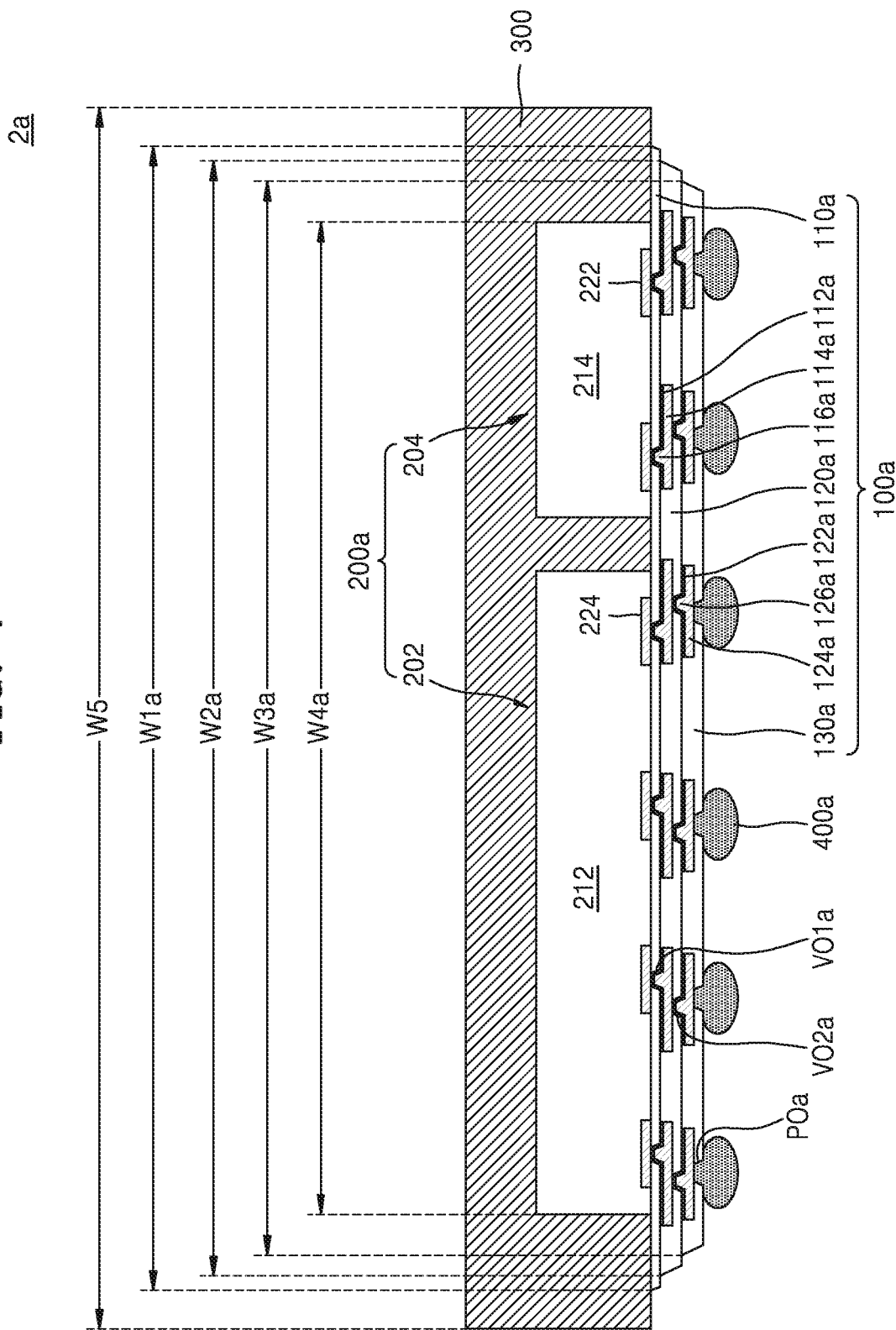
FIG. 7 is a cross-sectional view of a fan-out semiconductor package according to at least one embodiment.

FIG. 7 is a cross-sectional view of a fan-out semiconductor package 2a, according to at least one embodiment. Descriptions of aspects with respect to FIG. 7, the aspects being the same as those with respect to FIGS. 5A and 5B, will be omitted, and aspects with respect to FIG. 7, the aspects being different from those with respect to FIGS. 5A and 5B, will be mainly described.

Referring to FIG. 7, the fan-out semiconductor package 2a may include the redistribution line structure 100a and the plurality of semiconductor chips 200a spaced apart from each other on the redistribution line structure 100a.

The plurality of semiconductor chips 200a may include the first semiconductor chip 202 and the second semiconductor chip 204. The first semiconductor chip 202 may be, for example, a CPU chip, a GPU chip, or an AP chip. The second semiconductor chip 204 may be, for example, a DRAM chip, an SRAM chip, a flash memory chip, an EEPROM chip, a PRAM chip, an MRAM chip, or an RRAM chip. In some embodiments, the second semiconductor chip 204 may be an HBM DRAM semiconductor chip.

A footprint occupied by the plurality of semiconductor chips 200a may be less than a horizontal area of the redistribution line structure 100a. The footprint occupied by the plurality of semiconductor chips 200a may completely overlap the redistribution line structure 100a in a vertical direction.

The horizontal width W4a of the footprint occupied by the plurality of semiconductor chips 200a may be less than each of the horizontal width W1a of the first redistribution line insulating layer 110a, the horizontal width W2a of the second redistribution line insulating layer 120a, the horizontal width W3a of the third redistribution line insulating layer 130a, and the horizontal width W5 of the molding member 300.

Figure 8:
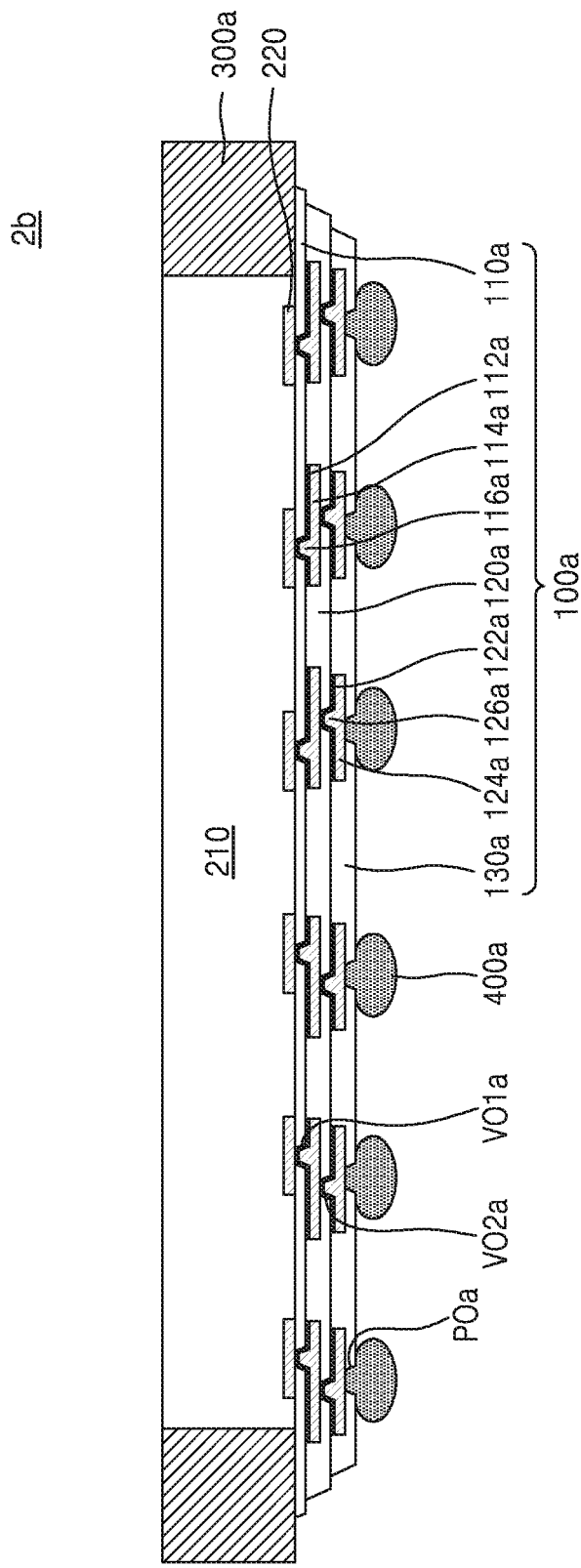
FIG. 8 is a cross-sectional view of a fan-out semiconductor package according to at least one embodiment.

FIG. 8 is a cross-sectional view of a fan-out semiconductor package 2b, according to at least one embodiment. Descriptions of aspects with respect to FIG. 8, the aspects being the same as those with respect to FIGS. 5A and 5B, will be omitted, and aspects with respect to FIG. 8, the aspects being different from those with respect to FIGS. 5A and 5B, will be mainly described.

Referring to FIG. 8, the fan-out semiconductor package 2b may include the redistribution line structure 100a and the semiconductor chip 200 on the redistribution line structure 100a.

The fan-out semiconductor package 2b may farther include the molding member 300a surrounding the semiconductor chip 200 on the redistribution line structure 100a. The molding member 300a may surround an upper surface of the redistribution line structure 100a and side surfaces of the semiconductor chip 200 and may not cover and may expose an upper surface of the semiconductor chip 200, the upper surface being a non-active surface. The molding member 300a may cover a portion of an upper surface of the first redistribution line insulating layer 110a from among the plurality of redistribution line insulating layers 110a, 120a, and 130a included in the redistribution line structure 100a.

The molding member 300a may not cover a side surface of each of the plurality of redistribution line insulating layers 110a, 120a, and 130a.

In some embodiments, a heat discharging member may be coupled on the upper surface of the semiconductor chip 200. The heat discharging member may be, for example, a heat slug or a heat sink. In some embodiments, a TIM may be arranged between the heat discharging member and the upper surface of the semiconductor chip 200.

While the inventive concepts have been particularly shown and described with reference to embodiments thereof, it will be understood that various changes in form and details may be made therein without departing from the spirit and scope of the following claims.

What is claimed is:

1. A fan-out semiconductor package comprising:
a redistribution line structure comprising a plurality of redistribution line insulating layers and a plurality of redistribution line patterns on at least one of an upper surface and a lower surface of each of the plurality of redistribution line insulating layers;
at least one semiconductor chip on the redistribution line structure and occupying a footprint having a horizontal width that is less than a horizontal width of the redistribution line structure; and
a molding member surrounding the at least one semiconductor chip on the redistribution line structure and having a horizontal width that is greater than the horizontal width of the redistribution line structure,
wherein the plurality of redistribution line insulating layers have a cascade structure, and
wherein side surfaces of each of the plurality of redistribution line insulating layers are inclined surfaces each having an acute angle from a normal line with respect to a lower surface of each of the plurality of redistribution line insulating layers.

2. The fan-out semiconductor package of claim 1, wherein a horizontal width of a redistribution line insulating layer from among the plurality of redistribution line insulating layers, farther from the at least one semiconductor chip, is greater than a horizontal width of the redistribution line insulating layer from among the plurality of redistribution line insulating layers, closer to the at least one semiconductor chip.

3. The fan-out semiconductor package of claim 2, wherein the molding member covers side surfaces of each of the plurality of redistribution line insulating layers.

4. The fan-out semiconductor package of claim 3, wherein a lower surface of the redistribution line insulating layer, farthest from the at least one semiconductor chip from among the plurality of redistribution line insulating layers, is coplanar with a lower surface of the molding member.

5. The fan-out semiconductor package of claim 1, wherein the horizontal width of the redistribution line insulating layer farther from the at least one semiconductor chip, is less than the horizontal width of the redistribution line insulating layer closer to the at least one semiconductor chip.

6. The fan-out semiconductor package of claim 5, wherein an upper surface of the redistribution line insulating layer, closest to the at least one semiconductor chip, is coplanar with a lower surface of the molding member.

7. The fan-out semiconductor package of claim 1, wherein a thickness of at least one of the plurality of redistribution line insulating layers is less than thicknesses of the others of the plurality of redistribution line insulating layers.

8. The fan-out semiconductor package of claim 7, wherein a thickness of the redistribution line insulating layer, closest to the at least one semiconductor chip, is less than thicknesses of the others of the plurality of redistribution line insulating layers.

9. The fan-out semiconductor package of claim 7, wherein a thickness of the redistribution line insulating layer, farthest from the at least one semiconductor chip, is less than thicknesses of the others of the plurality of redistribution line insulating layers.

10. The fan-out semiconductor package of claim 1, wherein at least one of the plurality of redistribution line patterns protrudes, in a horizontal direction, farther outside of a footprint of the at least one semiconductor chip.

11. A fan-out semiconductor package comprising:
a redistribution line structure comprising a plurality of redistribution line insulating layers having a cascade structure, and a plurality of redistribution line patterns on at least one of an upper surface and a lower surface of each of the plurality of redistribution line insulating layers;
at least one semiconductor chip on the redistribution line structure and electrically connected to the plurality of redistribution line patterns; and
a molding member surrounding the at least one semiconductor chip on the redistribution line structure,
wherein a horizontal width of a redistribution line insulating layer from among the plurality of redistribution line insulating layers, farther from the at least one semiconductor chip, is greater than a horizontal width of the redistribution line insulating layer closer to the at least one semiconductor chip.

12. The fan-out semiconductor package of claim 11, wherein the molding member protrudes farther than the redistribution structure in a horizontal direction.

13. The fan-out semiconductor package of claim 12, wherein the molding member has a horizontal width, greater than a horizontal width of a footprint occupied by the at least one semiconductor chip and a horizontal width of the redistribution line structure, and
the molding member covers a portion of an upper surface and side surfaces of each of the plurality of redistribution line insulating layers.

14. The fan-out semiconductor package of claim 11, wherein side surfaces of each of the plurality of redistribution line insulating layers are inclined surfaces each having an acute angle from a normal line with respect to a lower surface of each of the plurality of redistribution line insulating layers.

15. The fan-out semiconductor package of claim 14, wherein an acute angle of a side surface of the redistribution line insulating layer, farthest from the at least one semiconductor chip, is less than acute angles of side surfaces of the other of the plurality of redistribution line insulating layers.

16. The fan-out semiconductor package of claim 14, wherein the plurality of redistribution line insulating layers increase in horizontal width away from the at least one semiconductor chip.

17. A fan-out semiconductor package comprising:
a redistribution line structure comprising a plurality of redistribution line insulating layers having a cascade structure, a plurality of redistribution line patterns on an upper surface of at least one of the plurality of redistribution line insulating layers, and a plurality of redistribution line via patterns connected to the plurality of redistribution line patterns and penetrating at least one of the plurality of redistribution line insulating layers;
at least one semiconductor chip on the redistribution line structure and electrically connected to the plurality of redistribution line patterns and the plurality of redistribution line via patterns; and
a molding member surrounding the at least one semiconductor chip on the redistribution line structure, and protruding farther outside the redistribution line structure in a horizontal direction,
wherein side surfaces of each of the plurality of redistribution line insulating layers are inclined surfaces each having an acute angle from a normal line with respect to a lower surface of each of the plurality of redistribution line insulating layers, and
an acute angle of a side surface of one of the plurality of redistribution line insulating layers is less than acute angles of side surfaces of the other of the plurality of redistribution line insulating layers.

18. The fan-out semiconductor package of claim 17, wherein a thickness of a redistribution line insulating layer having a greatest horizontal width from among the plurality of redistribution line insulating layers, is less than thicknesses of the other redistribution line insulating layers.

19. The fan-out semiconductor package of claim 18, wherein an acute angle of a side surface of the redistribution line insulating layer having a greatest horizontal width from among the plurality of redistribution line insulating layers, is less than acute angles of side surfaces of the other redistribution line insulating layers.

20. The fan-out semiconductor package of claim 18, wherein the redistribution line insulating layer having the greatest horizontal width from among the plurality of redistribution line insulating layers, is closest to the at least one semiconductor chip than the other redistribution line insulating layers.

* * * * *